United States Patent
Zhou et al.

(10) Patent No.: US 11,411,521 B2
(45) Date of Patent: Aug. 9, 2022

(54) METHOD FOR STATIC ECCENTRICITY FAULT DETECTION OF INDUCTION MOTORS

(71) Applicant: Mitsubishi Electric Research Laboratories, Inc., Cambridge, MA (US)

(72) Inventors: Lei Zhou, Austin, TX (US); Bingnan Wang, Belmont, MA (US); Chungwei Lin, Cambridge, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 112 days.

(21) Appl. No.: 17/071,277

(22) Filed: Oct. 15, 2020

(65) Prior Publication Data
US 2022/0123680 A1    Apr. 21, 2022

(51) Int. Cl.
*H02P 23/14* (2006.01)
*G01R 31/34* (2020.01)
*H02H 7/08* (2006.01)
*G01R 19/165* (2006.01)

(52) U.S. Cl.
CPC ........ *H02P 23/14* (2013.01); *G01R 19/16571* (2013.01); *G01R 31/343* (2013.01); *H02H 7/0833* (2013.01); *H02P 2207/01* (2013.01)

(58) Field of Classification Search
CPC .............. H02P 23/14; H02P 2207/01; G01R 19/16571; G01R 31/343; H02H 7/0833
See application file for complete search history.

(56) References Cited

U.S. PATENT DOCUMENTS

| | | | |
|---|---|---|---|
| 2011/0089882 A1* | 4/2011 | Yeh | G01R 31/343 180/65.285 |
| 2011/0313717 A1 | 12/2011 | Lu | |
| 2012/0007461 A1* | 1/2012 | Wang | H02K 17/165 310/198 |
| 2013/0338939 A1* | 12/2013 | Nandi | G01R 31/343 702/38 |
| 2015/0260794 A1* | 9/2015 | Athikessavan | G01R 31/343 702/58 |
| 2018/0241332 A1* | 8/2018 | Ottewill | H02P 21/16 |

FOREIGN PATENT DOCUMENTS

EP    2919027    9/2015

* cited by examiner

*Primary Examiner* — Rina I Duda
(74) *Attorney, Agent, or Firm* — Gennadiy Vinokur; Hironori Tsukamoto

(57) ABSTRACT

A system for controlling an operation of an induction motor (IM). A controller processor detects a spectrum of a current signal from received sensor data using a module. Obtain a number of rotor bars and a number of pole pairs of the IM to identify a principle slot harmonics (PSH) type IM from stored IM data. Use the PSH-type IM to identify a static eccentricity (SE) fault signature signal located at a secondary PSH frequency of the PSH-type IM. Determine a level of signal strength in the spectrum of the current signal at a location of the secondary PSH frequency, and compare to a SE fault table database to obtain a SE fault level of the PSH-type IM. Compare the SE fault level to a database to obtain a SE fault threshold, and if the SE fault level is outside the SE threshold, generate an interrupt command to the controller.

21 Claims, 19 Drawing Sheets

(Static Eccentricity)

(Mixed Eccentricity)

(Healthy operational motor)

(Dynamic Eccentricity)

Table I
Static Eccentricity Detection

| | Non-PSH IM | | PSH IM |
|---|---|---|---|
| | Case A: $R = 2p\beta(m \pm q) \pm r] \pm 1$ | Case B: $R = 2p\beta(m \pm q) \pm r] \pm 2$ | Case C: $R = 2p\beta(m \pm q) \pm r]$ |
| (1) | Large SE signature signal | Small SE signature signal | Irrelevant to SE: Not Detectable |
| (2) | Large SE signature signal | Small SE signature signal | |
| (3) | | | Small SE signature signal at secondary PSH frequency: Detectable |

(1) Static eccentricity detection method (2) Prior art methods considering only fundamental harmonic of air gap permeance (3) Methods of the present disclosure consider 2nd-order harmonic air gap permeance

FIG. 3

(Flow chart of eccentricity fault detection for induction motors)

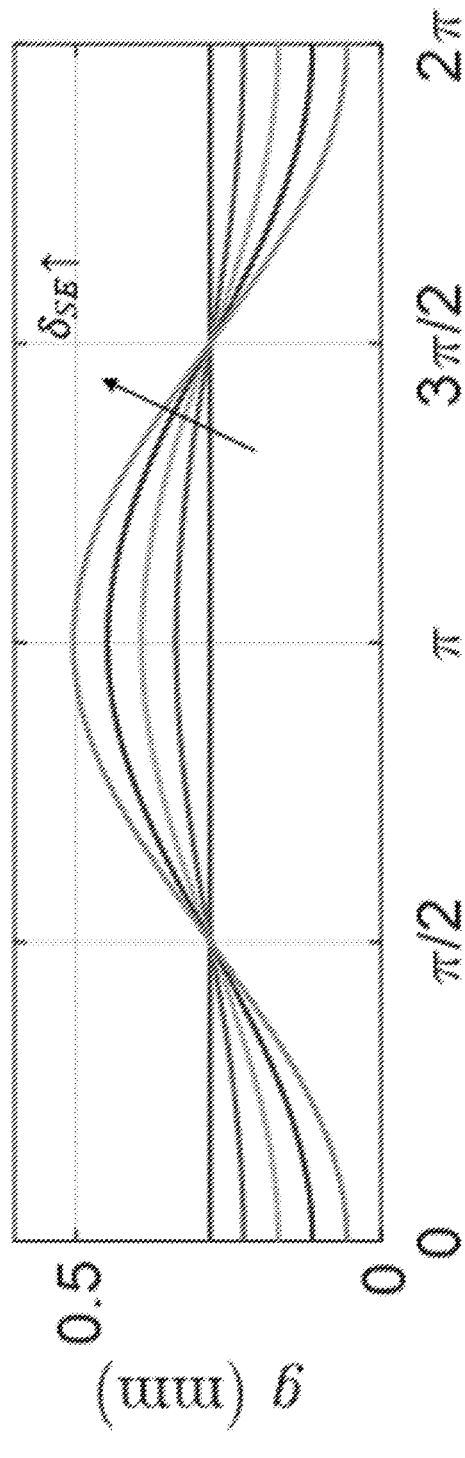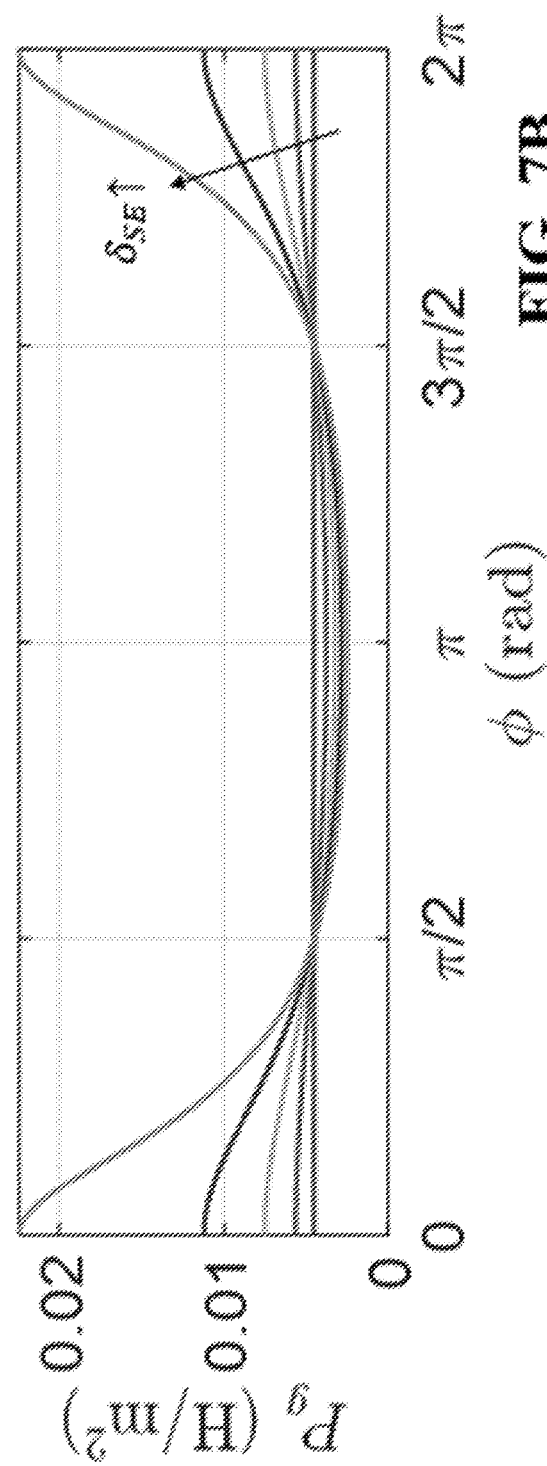

Table II
Parameters of the Evaluated PSH-Type Induction Motor

| Parameter | Value |
|---|---|
| Number of pole pairs | 2 |
| Number of bars | 28 |
| Number of stator slots | 36 |
| Number of turns per slot | 37 |
| Nominal air gap length | 0.28 mm |
| Air gap radius | 41.6 mm |
| Stack length | 80 mm |
| Carter's coefficient | 1.38 |

FIG. 8

(FEM simulated Group III induction motor (2 pole pair, 28 bar) line current under varying static eccentricity levels: FIG. 7A-current spectrum, FIG. 7B--PSH current amplitude)

METHOD FOR STATIC ECCENTRICITY FAULT DETECTION OF INDUCTION MOTORS

TECHNICAL FIELD

The present disclosure relates generally to induction motors, and more generally to estimating static eccentricity fault severity for a group of principle slot harmonic (PSH) induction motors's that have PSH signals.

BACKGROUND

Conventional induction machines can be used in various industry applications including pumps systems, centrifuge systems, chemical systems, petrochemical systems, electrified transportation systems, etc. In many applications, these machines are operated under unfavorable conditions, such as high ambient temperature, high moisture and overload, which can eventually result in motor malfunctions that lead to high maintenance cost and severe financial loss due to unexpected downtime. The malfunction of induction machines is generally attributed to faults of different categories, which include drive inverter failures, stator winding insulation breakdowns, broken rotor bar faults, along with mechanical faults such as bearing faults and eccentricity. Several surveys of faults of induction machines conducted by the IEEE Industry Application Society (IEEE-IAS) and the Japan Electrical Manufacturers' Association (JEMA) reveal that the mechanical faults are the most common fault type.

Eccentricity is a type of motor fault caused by the formation of unequal air gap between the stator bore and the rotor. For example, in a healthy motor, the rotor is center-aligned with the stator bore, and the rotor's center of rotation is the same as the geometric center of the stator bore. Eccentricity related fault occurs when air gap between the stator and rotor becomes unequal. Air gap eccentricity fault can occur due to inaccurate positioning of the rotor with respect to the stator, bearing wear, stator core movement, shaft deflection, etc. There are three types of motor eccentricity fault: dynamic eccentricity (DE), static eccentricity (SE), and mixed eccentricity (ME) which is a combination of both DE and SE. According to DE, the rotor is also displaced from the stator center, but the rotor rotates around the center of the stator center, i.e. the center of the rotor isn't at the center of the rotation. For this reason the position of minimum air gap rotates with the rotor. Several factors contribute to DE faults, such as a bent rotor shaft, bearing wear or misalignment of bearings, mechanical resonance at critical speed, etc.

The static eccentricity (SE) fault occurs when the rotor rotates about its own centerline, but this centerline does not coincide with that of the centerline of the stator bore, i.e. the rotor is displaced from the stator center, but the rotor rotates around its own center. SE can be caused by oval stator cores or by an incorrect positioning of the stator or rotor. It is possible that the SE and the dynamic eccentricity (DE) simultaneously occur, and in that case, the center of the stator, the center of the rotor and the rotation axis are displaced with respect to each other. In regard to identifying static eccentricity, the effects of static eccentricity can be observed by an existence of sideband components that occur around the fundamental frequency in current and voltage spectra while the motor is running at a quarter of full load.

Accordingly, there is a need for systems and methods for quantitative detection of static eccentricity (SE) fault for a group of principle slot harmonic (PSH) induction motors's that have PSH signals, among other aspects.

SUMMARY

The present disclosure relates to induction motors, and more particularly to estimating static eccentricity (SE) fault severity for a group of principle slot harmonic (PSH) induction motors's (IMs) that have PSH signals.

Specifically, some embodiments are designed to detect SE faults for the group of principle slot harmonic induction motor's (PSH-type IMs) that have a special combination of a number of rotor bars and pole pairs. Diagnosis of SE faults for IMs can be for quality testing or checking during their manufacturing process. If the SE fault diagnosis is not detected during the manufacturing process, the IM motors will eventually fail, of which, the reason why the IM fails is discussed later.

Conventional static eccentricity (SE) fault detection methods use a motor current signature analysis method using the PSH current signal. However, today's conventional SE fault detection methods cannot detect SE faults for these specific PSH-type IMs. At least one main problem is this specific group of motors always have PSH signals generated under both healthy and eccentric fault conditions. Where a PSH current signal amplitude does not show significant dependency on eccentricity levels, which is used by today's conventional SE fault detection methods for detecting SE faults. Which means, or translates to, for these specific PSH-type IMs (i.e. having a special combination of a number of rotor bars and pole pairs), there are no known methods today for detecting SE faults? This long standing unsolved conventional problem costs the IM industry every year substantial amounts of lost dollars, i.e. for repair and compensation to IM consumers for failed IMs within warranty periods, loss of company reputations, along with many other negative effects to both the IM industry and IM consumers.

At least one realization of the present disclosure is discovering systems and methods for a pure SE fault detection for this specific group of PSH-type IMs with a special combination of a number of rotor bars and pole pairs. What was learned from experimentation is that a second-order harmonic in the air gap permeance can induce an SE-level-related signal in the line current of PSH-type three-phase IMs with Y-connected windings. Specifically, this SE fault signature current signal is generated based on the fundamentals of harmonics of stator-generated magnetomotive-forces (MMFs). The signature signal is produced due to the PSH-type IMs having a special combination of a number rotor bars and a number pole pairs. Wherein, this generation mechanism of the signature signal was validated by experimental test simulations with PSH-type three-phase IMs. An analytical motor model of the present disclosure used the signature signal for quantitative detection of SE faults for the PSH-type three-phase IMs.

To better grasp SE faults for PSH-type three-phase IMs, aspects of understanding of eccentricity should be known. For example, eccentricity is a type of induction motor (IM) fault caused by a formation of an unequal air gap between a stator bore and a rotor being non-uniform. There are three types of induction motor eccentricity faults: the static eccentricity (SE), a dynamic eccentricity (DE), and a mixed eccentricity (ME), i.e. the ME is a mixture of both static and dynamic eccentricity. SE of induction motors is created during the manufacturing process due to an ovality of a stare bore, a misalignment of bearings, etc. Detection of SE fault is best at an early stage, and in fact essential, as the SE fault can evolve into ME fault over increased operation time of the IMs. The SE fault can be due to an unbalanced magnetic pull, that can lead to ME faults and which can finally lead to the IMs breaking down, failing, so as unable to operate. The different types of induction motors all include a stator, a rotor, a shaft, and bearings. Some IMs can be a squirrel-cage induction motor, wherein an eccentricity fault of the IMs occurs due to the manufacturing error, as noted above, resulting in an air gap between the stator and the rotor non-uniform.

Some embodiments of the present disclosure incorporate the second-order harmonic of the air gap permeance that generate a SE fault signature current signal for SE fault in the PSH-type IM's current, that provides for SE fault detection for the PSH-type IM's. The SE fault signature current signal is located at the secondary PSH frequency, and the signature signal has a polynomial dependency on a level of static eccentricity, which is a relatively small signal. The signals are filtered around the secondary PSH signal, and the resultant SE fault signature current signal is compared with a pre-computed lookup SE fault signature current signal table of motor design parameters of the present disclosure to find a level of static eccentricity.

In other words, the second-order harmonic of the air gap permeance can induce an SE-dependent signal in the motor's line current for PSH-type IM. This signal provides a novel approach for PSH-type IM's SE detection based on effective motor current signature analysis (MCSA), which overcomes and solves the longstanding problems with today's conventional methods. Specifically, the amplitude of the secondary principle slot harmonics (PSH) current signal is varying with respect to a level of SE, and can be used for SE fault detection for Y-connected PSH-type induction motors. Wherein the Y-connected aspect means that the machine windings are connected in a three-wire Y-configuration with either isolated or floating neutral. Some detection approaches for SE fault for these PSH-type IM's of the present disclosure were develop and constructed to include: (1) detecting a spectrum of a current signal from IM sensor data using a signal processing module (i.e. a fast Fourier transformation operation to calculate the spectrum of the signature signal); (2) using stored IM data to, obtain a number of rotor bars and a number of pole pairs of the IM to identify a principle slot harmonics (PSH)-type IM from a set of IMs, and use the identified PSH-type IM to identify a SE fault signature current signal located at a secondary PSH frequency of the PSH-type IM; (3) determining a level of signal strength in the spectrum of the current signal at a location of the secondary PSH frequency, and compare to a SE fault table database to obtain a SE fault level of the PSH-type IM; and (4) comparing the SE fault level to an anomaly database having a same corresponding SE fault level, to obtain a SE fault threshold, and if the SE fault level is outside the SE threshold, generate and send an interrupt command with an associated action to the controller.

The importance of the second-order harmonic of the air gap permeance was realized through test analysis approaches during experimentation directed at finding an effective motor current signature analysis (MCSA) based on SE fault detection methods for three-phase PSH-type IMs, i.e. with a special combination of a number of rotor bars and pole pairs. Some tests approaches considered only a constant and first harmonic terms of the air gap permeance, which resulted in "not" capturing the eccentricity-related signals generated due to higher-order air gap permeance harmonics. However, by calculating and plotting the Fourier coefficients of a first few harmonics of an air gap permeance function, what was later realized is that a second-order harmonic of the air gap permeance function was evident when an eccentricity fault becomes significant in the rotor, as compared to a fundamental and a first-order harmonics of an air gap permeance function. Therefore, a realization was that by neglecting a second-order harmonics of the air gap permeance function can result in wrong conclusions in analyzing eccentricity-related signals.

Thus, further tests followed including experimental approaches with the fundamentals of harmonics of stator-generated magnetomotive-forces (MMFs). To explain MMFs, MMFs act on the air gap permeance, produces an air gap flux distribution, and the stator-generated flux induced currents in the rotor bars generate a rotor MMF. In an IM, a fundamental harmonic of a stator-generated magnetomotive-force (MMF) has several components including a number of pole pairs, a supply angular frequency a mechanical angular position in a stator-fixed reference frame and an amplitude of the fundamental harmonic of the stator MMF. When the induction motor is having a static eccentricity (SE) fault, the air gap can include a nominal air gap length, a Carter's coefficient to correct the air gap length for slotting effects via the stator slots, and a SE level. Wherein an air gap permeance of the induction motor was calculated and represented with Fourier series. Observed during testing is that the stator MMF acting on the air gap permeance, produces an air gap flux distribution. For example, the stator-generated flux induced currents in the rotor bars generated a rotor MMF. Aside from the harmonics that are having the same wave-length with the stator-generated air gap fluxes, what was observed is that there were additional rotor slot harmonics also generated. Such rotor slot harmonics were visualized as the original waveforms sampled by the discrete rotor bars, and acted across the gap again and generated an air gap flux. What was learned is that upon calculating the rotor-generated air gap flux there were several different harmonics.

What was also recognized from these test approaches is that the generation of SE-related current signature signals were due to the air gap fluxes, and that the frequency of the generated current signal was always the PSH frequency. In order to generate line current signals in the motor windings, the air gap flux needed to induce none-zero-sequence voltage in the stator windings. Also noted is that the air gap flux exists under both a healthy and eccentric conditions, and the air gap flux can generate PSH signals when the motor has meant a certain condition. For a specific motor type, only one PSH signal can be generated.

Some embodiments of the present disclosure can be used for monitoring and controlling an operation of the induction motor by gathering various measurements as inputs into the system. For example, a controller coupled with the induction motor and the system can control operations of the induction motor based on inputs received from sensors configured to acquire the measurement data pertaining to the operating conditions of the induction motor. The measurement data obtained from the electrical signal sensors, i.e. current sensors, voltage sensors, or both, are used for acquiring current and voltage data of the induction motor. For example, the current sensor senses current data from one or more of the multiple phases of the induction motor. Some embodiments of the present disclosure include an induction motor having a three-phase induction motor, wherein current and voltage sensors sense the current and voltage data from the three phases of the three-phase induction motor.

Practical Applications

The systems and methods of the present disclosure can utilize the signature signal in the motor's current for quantitative detection of SE fault for PSH-type IMs. In particular, a diagnosis of SE faults for induction motors can be utilized for quality checking during their manufacturing process, among other aspects. Wherein the systems and methods of the present disclosure can accurately model the induction motor ball bearing faults using a modified winding function theory (MWFT). So as to show that the stator current spectrum can be calculated, and the fault severity of a bearing fault can be quantified with an amplitude of the corresponding faulty current component.

The systems and methods of the present disclosure have overcome the problems with conventional IM methods failing to identify actual motor loss to facilitate the motor design process. Wherein, the approaches of the present disclosure have developed a motor fault diagnosis technique (s) using motor current signal, such that the motor fault diagnosis can be utilized for highly accuracy motor fault detection. Some industry applications that the systems and methods of the present disclosure can be used includes pumps systems, centrifuge systems, chemical systems, petrochemical systems, electrified transportation systems, etc.

Experimentation

During experimentation some test approaches included using a motor current signature analysis (MCSA) due to the MCSA method advantage of being low-cost, reliable and having a simple configuration, along with not having to require additional sensors or data acquisition hardware. For the tested induction motors with pure static eccentricity fault, the signature frequency in the current signal was determined by $$f_h = \left((kR \pm n_d)\frac{1-s}{p} \pm v\right)f, \quad (1)$$

where
 $f$ is the fundamental supply frequency,
 R is the number of rotor slots,
 s is the slip, p is number of pole pairs,
 k is any positive integer,
 $n_d$ is the eccentricity order that takes value of 0 for static eccentricity, and 1, 2, 3, . . . for dynamic eccentricity
 v is the order of stator time harmonics.
where the frequency in (1) matches with the motor's principle slot harmonic (PSH) signals when k=v=1.

The signature current signals at frequencies in (1) were effective for most three-phase induction motors for eccentricity fault detection. However, what was later discovered from these test MCSA experimental approaches is that when an induction motor is having a pole pair number p and rotor slot number R combination that satisfy $$R=2p[3(m\pm q)\pm r], \quad (2)$$

where m±q=0, ±1, ±2, . . . , and r=0 or 1, the current at signature frequencies shown in (1) failed to detect the pure static eccentricity faults. This is because in this group of induction machines the PSH current signal are generated under both healthy and eccentric conditions, and its amplitude does not show significant dependency on eccentricity level. Based upon further testing and model-based simulations, and what was discovered is that there simply does not exist an effective MCSA-based static fault detection method for PSH type induction motors.

According to an embodiment of the present disclosure, a system for monitoring and controlling an operation of an induction motor (IM). The system including sensors obtain sensor data from the IM within a time period. A controller coupled with the IM, the sensors and a memory. Wherein the memory includes stored databases and modules having executable instructions, and stored data including IM data. A processor of the controller is configured to detect a spectrum of a current signal from the sensor data using a signal processing module. Use the stored IM data to obtain a number of rotor bars and a number of pole pairs of the IM, to identify a principle slot harmonics (PSH) type IM from a set of IMs, and use the PSH type IM to identify a static eccentricity fault signature signal located at a secondary PSH frequency of the PSH type IM. Identify a level of signal strength in the spectrum of the current signal at a location of the secondary PSH frequency. Compare with a pre-computed SE fault table database to obtain a level of SE fault of the PSH-type IM; and compare the level of SE fault with a same corresponding level of an SE fault associated with a SE threshold with an anomaly database; and if outside the SE threshold, generate and send a SE fault operation interrupt command along with at least one command action for the time period. Receive the interrupt command and that at least one command action by the controller. The controller stops the PSH-type IM operation, and outputs the at least one command action to a communication network based on the interrupt command.

According to another embodiment of the present disclosure, a system for monitoring and controlling an operation of an induction motor (IM). The system including sensors obtain operating conditions of the IM including sensed current data and voltage data from one or more of multiple phases of the IM within a time period. A controller is coupled with the IM, the sensors and a memory, the memory including stored databases and modules having executable instructions and data including IM data of the IM, and the controller controls operations of the IM based on receiving the sensor data. A processor of the controller is configured to use a signal processing module to detect a spectrum of a current signal from the sensor data. Use the stored IM data to obtain a number of rotor bars and a number of pole pairs of the IM obtained from the sensor data, to identify a principle slot harmonics (PSH) type IM and a static eccentricity fault signature signal located at a secondary PSH frequency of the PSH type IM. Identify a level of signal strength in the spectrum of the current signal at the location of the secondary PSH frequency, and compare the identified level of the signal strength with a lookup table database to obtain a level of static eccentricity fault of the PSH type IM. Compare the obtained level of static eccentricity fault to an anomaly database, with a static eccentricity threshold of a same level of static eccentricity fault from the anomaly database, and if the obtained level of static eccentricity fault is outside the eccentricity threshold. Generate a static eccentricity fault operation interrupt command to stop the operation of the PSH IM, and send the operation interrupt command to the controller. Receive the eccentricity fault operation interrupt command by the controller, the controller interrupts the operation of the PSH IM based upon the obtained level of static eccentricity fault from the eccentricity fault operation interrupt command, which also includes an operation inspection and repair action, that is initiated and outputted to a communication network by the controller for further inspection or repair of the PSH type IM.

Another embodiment of the present disclosure a system for monitoring and controlling an operation of a principle slot harmonics induction (PSHI) motor. The system including sensors obtain sensor data including operating conditions of the PSHI motor, a controller is coupled with the PSHI motor, the sensors and a memory, the memory includes stored databases, modules having executable instructions and data including PSHI motor data, and the controller controls operations of the PSHI motor based on the sensor data. A processor of the controller is configured to detect a spectrum of a current signal from the sensor data using a signal processing module. Access the PSHI motor data to identify a number of rotor bars and a number of pole pairs of the PSH motor, and then identify a static eccentricity fault signature signal located at a secondary PSH frequency of the PSHI motor. Identify a level of signal strength in the spectrum of the current signal at the location of the secondary PSH frequency and compare the identified level of the signal strength with a lookup table database to obtain a level of static eccentricity fault of the PSH type motor. Compare the obtained level of static eccentricity fault to an anomaly database, with a static eccentricity threshold of a same level of static eccentricity fault from the anomaly database, and if the obtained level of static eccentricity fault is outside the eccentricity threshold. Generate a static eccentricity fault operation interrupt command to stop the operation of the PSH motor, and send the operation interrupt command to the controller. Receive the eccentricity fault operation interrupt command by the controller. The controller interrupts the operation of the PSH motor based upon the obtained level of static eccentricity fault from the eccentricity fault operation interrupt command, which also includes an operation inspection and repair action that is initiated and outputted to a communication network by the controller for further inspection or repair of the PSH type induction motor.

Another embodiment of the present disclosure a system for controlling an operation of an induction motor (IM). The system including sensors that obtain sensor data of the IM including current data and voltage data within a time period. A controller is coupled with the IM, the sensors and a memory. The memory including stored databases and modules having executable instructions and data including IM data of the IM, and the controller controls operations of the IM based on receiving the sensor data. A processor of the controller is configured to detect a spectrum of a current signal from the sensor data using a signal processing module. Use the IM data to, obtain a number of rotor bars and a number of pole pairs of the IM to identify the IM from a set of IMs. Wherein the set of IMs include a squirrel cage induction motor having a number of rotor bars with a motor configuration including a rotor positioned inside and a stator assembly outside. Use the IM to identify a static eccentricity (SE) fault signature signal located at a secondary PSH frequency of the IM. Determine a level of signal strength in the spectrum of the current signal at a location of the secondary PSH frequency, and compare to a SE fault table database to obtain a SE fault level of the IM. Compare the SE fault level to an anomaly database to obtain a SE fault threshold, and if the SE fault level is outside the SE threshold, generate and send an interrupt command with an associated command action to the controller for the time period. Stop the IM operation upon receiving the interrupt command by the controller, and output the command action to a communication network to control the operation of the IM based on the command action.

BRIEF DESCRIPTION OF THE DRAWINGS

The presently disclosed embodiments will be further explained with reference to the attached drawings. The drawings shown are not necessarily to scale, with emphasis instead generally being placed upon illustrating the principles of the presently disclosed embodiments.

FIG. 2A shows an induction motor that is healthy, FIG. 2B shows a static eccentricity (SE) fault, FIG. 2C shows a dynamic eccentricity (DE) fault and FIG. 2D shows mixed eccentricity (ME), according to some embodiments of the present disclosure;

FIG. 3 is a table illustrating a categorization of the induction motors and its impact on the SE fault detection, as well as a major difference between conventional approaches and the approach analysis of the present disclosure, according to some embodiments of the present disclosure;

FIG. 7A and FIG. 7B are graph illustrating air gap length and air gap permeance as functions of mechanical angle under varying static eccentricity, according to some embodiments of the present disclosure;

FIG. 8 is a table illustrating parameters of an evaluated PSH-type induction motor, according to some embodiments of the present disclosure;

FIG. 10A illustrates the air gap permeance model I, and FIG. 10B shows the air gap permeance model II, according to some embodiments of the present disclosure;

FIG. 11A illustrates the current spectrum, and FIG. 1B shows the current magnitude of the two PSH frequencies, according to some embodiments of the present disclosure;

FIG. 12A illustrates a phase A voltage, and FIG. 12B shows line-to-line voltage between phase A and phase B, according to some embodiments of the present disclosure;

While the above-identified drawings set forth presently disclosed embodiments, other embodiments are also contemplated, as noted in the discussion. This disclosure presents illustrative embodiments by way of representation and not limitation. Numerous other modifications and embodiments can be devised by those skilled in the art which fall within the scope and spirit of the principles of the presently disclosed embodiments.

DETAILED DESCRIPTION

The present disclosure relates generally to interior permanent magnet synchronous (IPMS) machines, and more particularly to evaluating electromagnetic performance including estimating an electromagnetic and loss analysis for the IPMS machines.

Figure 1A:
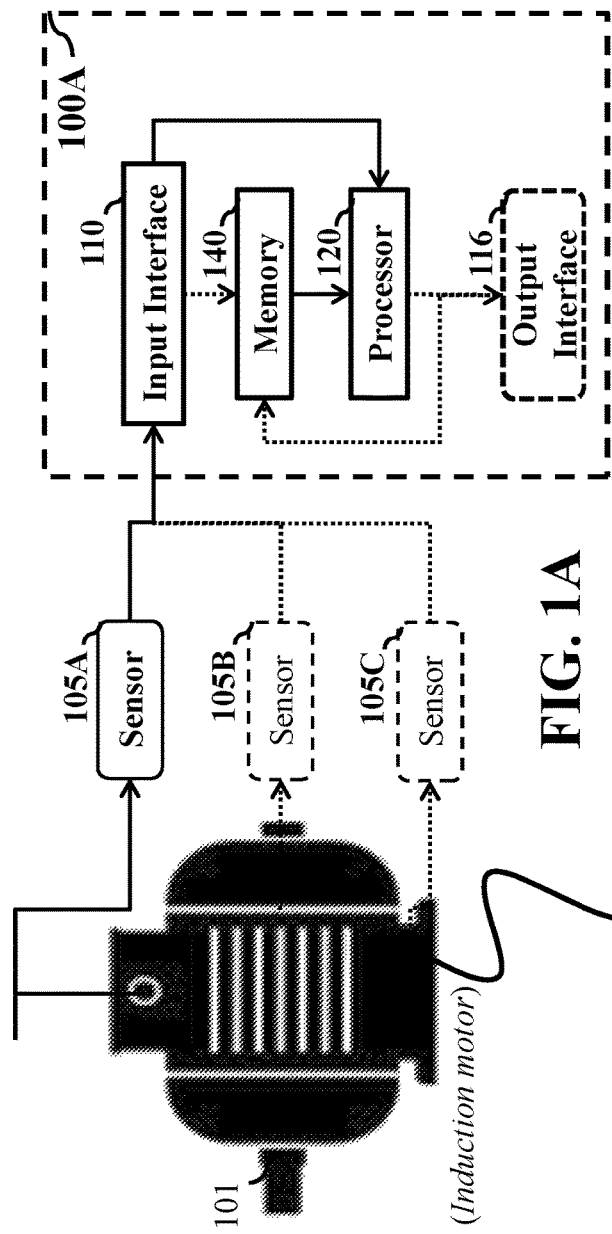
FIG. 1A is schematic diagram along with a block diagram illustrating a system for detecting and/or classifying types and severity of faults in an operation of an induction motor, according to an embodiment of the present disclosure.

FIG. 1A is schematic diagram along with a block diagram illustrating a system for detecting and/or classifying types and severity of faults in an operation of an induction motor, according to an embodiment of the present disclosure. For example, sensor 105A, 105B, 105C are connected via wirelessly or wire to the induction motor 101. The sensor data gathered from the sensors 105A, 105B, 105C is inputted into an input interface 110, which can be stored in a memory 140. The sensor data is then processed by a processor 120 and either outputted to an output interface 116, or can be stored in the memory 140, depending on a user/operator goals/interests.

Figure 1B:
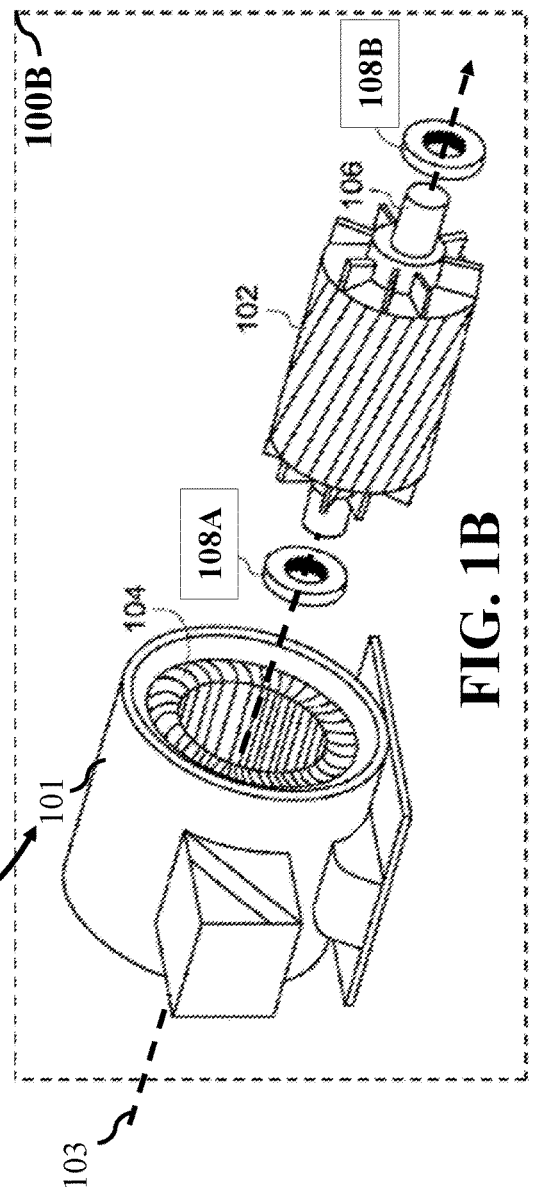
FIG. 1B is a schematic of the induction motor of FIG. 1A, according to some embodiments of the present disclosure.

FIG. 1B is a schematic of the induction motor of FIG. 1A, according to some embodiments of the present disclosure. For example, referring to FIG. 1A and FIG. 1B, the induction motor 101 comprises one stator 104, one rotor 102, one shaft 106, and two bearings 108A, 108B. The induction motor 101 is a squirrel-cage induction motor. A eccentricity fault of the motor is typically due to the manufacturing error, which makes the air gap between the stator 104 and the rotor 102 non-uniform.

Figure 1C:
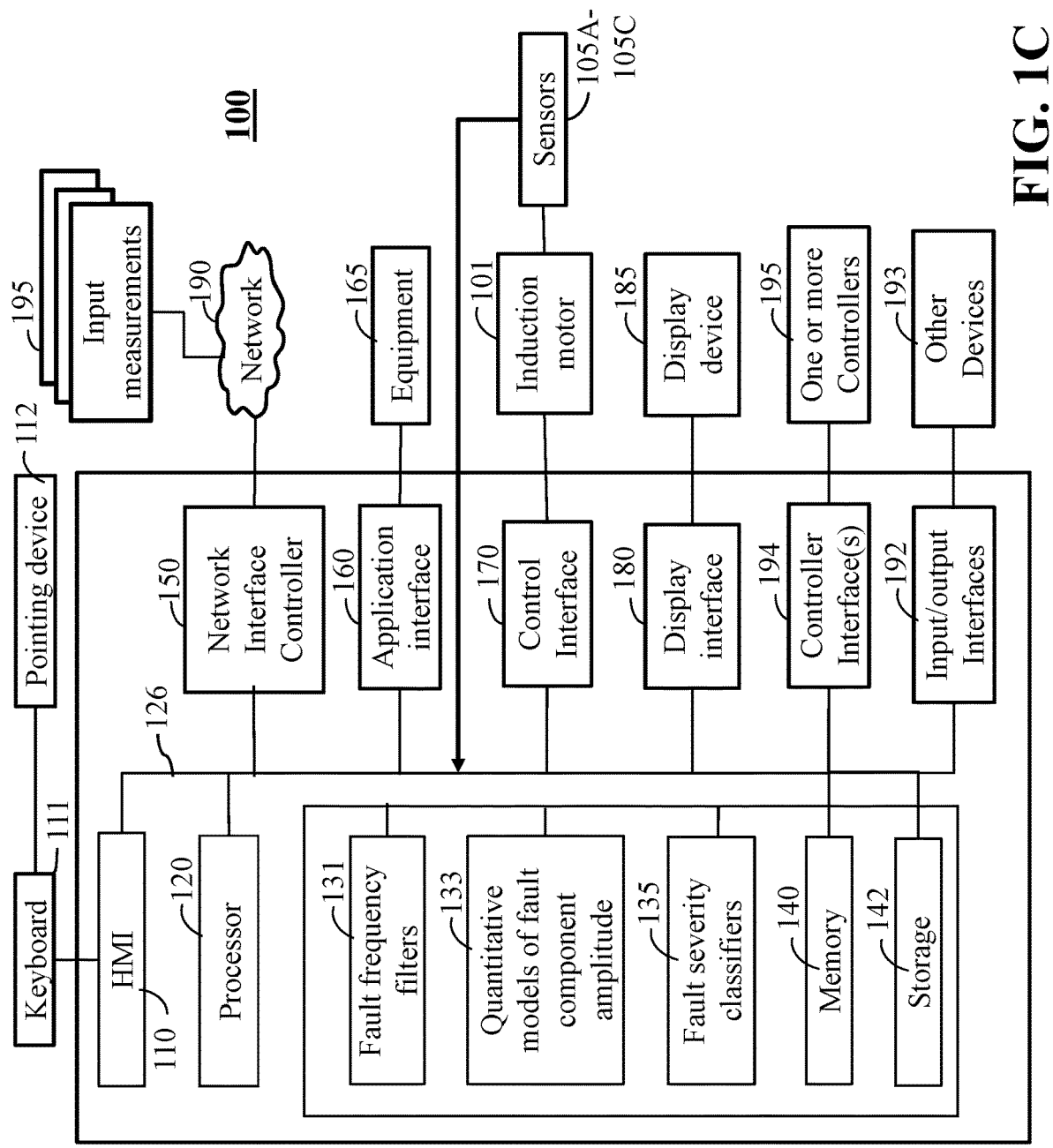
FIG. 1C is a schematic of a control system of the induction motor of FIG. 1A, according to some embodiments of the present disclosure.

FIG. 1C is a schematic of a system of the induction motor of FIG. 1A, according to some embodiments of the present disclosure. For example, the system 100 can be used for monitoring and controlling the operation of the induction motor 101 by taking sensor data that can include measurements as inputs. For example, a controller 195 coupled with the induction motor 101 and the system 100 can control operations of the induction motor based on inputs received from sensors 105A, 105B, 105B configured to acquire data pertaining to operating conditions of the induction motor 101. The electrical signal sensors 105A-105C can be current and/or voltage sensors for acquiring current and voltage data pertaining to the induction motor 101. For example, the current sensor senses current data from one or more of the multiple phases of the induction motor. Other sensors are contemplated including video camera sensors, environmental sensors (temperature, humidity, etc.), and other types of sensors used to assist the operation, maintenance or management of the system (not shown).

Referring to to FIG. 1A, FIG. 1B and FIG. 1C, the induction motor 101 can be a three-phase induction motor, the current and voltage sensors can sense the current and voltage data from the three phases of the three-phase induction motor 101. The system 100 can be configured for estimating a severity of eccentricity fault in the induction motor 101, and or other types of eccentricity faults depending upon the user/operature goals/interests. In the system, the current and voltage sensors respectively detect stator current and voltage data from the stator assembly 104 of the induction motor 101. The current data and voltage data acquired from the sensors is communicated to the controller 195 and/or the fault detection module for further processing and analysis. The analysis includes performing current signature analysis (CSA) to detect faults within the induction motor 101. For example, a storage 142 can include databases and modules, along with other data.

For example, contemplated for at least one embodiment of the present disclosure is a system for monitoring and controlling an operation of an induction motor (IM) 101. The system can include sensors 105A, 105B, 105C that obtain sensor data from the IM 101 either wirelessly or wired. The sensor data can include current (or at the moment in time or near the moment in time the sensor data is collected within a time period) operating conditions of the IM such as sensed current data and voltage data from one or more of multiple phases of the IM. As noted above, other sensor (not shown) can also gather data associated with the system including environmental sensors, humidity sensors, earthquake or natural disaster related sensors, temperature sensors, etc., i.e. sensors related to operation, maintenance and management of the system under all types of operating conditions. Noted is that the system can be connected to the system 100, or may be part of the system. A controller 195 can be coupled with the IM 101, the sensors 105A, 105B, 105C and a memory 140, wherein the memory 140 or storage 142 can include databases and modules having executable instructions, and data including IM data. A processor 120 of the controller 195 can be configured to detect a spectrum of a current signal from the sensor data using a signal processing module (stored in either the memory 140 or the storage 142). Contemplated is that each controller 195 may include a separate operating processor and other components (not shown), all of which depends on a user/operature goals and specific requirements.

Still referring to FIG. 1A, FIG. 1B and FIG. 1C, the stored IM data can be used to obtain a number of rotor bars and a number of pole pairs of the IM 101, to identify a principle slot harmonics (PSH) type IM from a set of IMs. For example, the PSH-type IM can be associated with a particular formula corresponding to a type of IM, i.e. such as the PSH-type IM that can include $R=2p[3(m+/-q)+/-r]$, where $(m+/-q)=1, 2, \ldots$ and $r=0$ or $1$, such that R is a number of rotor bars, p is a number of pole pairs, in is an integer, and q is an integer.

Upon determining the motor type, the PSH-type IM 101 can be used to identify a static eccentricity fault signature signal located at a secondary PSH frequency of the PSH type induction motor, via the stored IM data. The system can also identify other eccentricity faults, for example, upon identifying the number of rotor bars and the number of pole pairs associated with the type of IM, then, the type of eccentricity fault can be identified. The identified type of eccentricity fault, for example, can be a dynamic eccentricity fault, a mixed eccentricity fault or the SE fault. Wherein for each type eccentricity fault identified there is a corresponding stored database in the memory 140 or the storage 142 that can be accessed. For example, the memory 140 or the storage 142 can include a pre-computed dynamic eccentricity fault database that is used to obtain a level of dynamic eccentricity fault of the identified type of IM, or a pre-computed mixed eccentricity fault database that is used to obtain a level of mixed eccentricity fault of the identified type of IM.

Still referring to FIG. 1A, FIG. 1B and FIG. 1C, the system can identify a level of signal strength in the spectrum of the current signal at a location of the secondary PSH frequency. The signal processing module (i.e. stored in either the memory 140 or the storage 142) can be access that includes a fast Fourier transformation operation used to calculate the spectrum of the current signal. The computed spectrum of the current signal is compare with the pre-computed SE fault table database (i.e. stored in the memory 140 or the storage 142) to obtain a level of SE fault of the PSH-type IM. Then, the obtained level of SE fault is compared with a same corresponding stored level of a SE fault of a same PSH-type IM in an anomaly database (i.e. stored in the memory 140 or the storage 142). Of which, the stored level of the SE fault also includes corresponding information that the stored level of the SE fault is either above or below a specific SE threshold. If outside the SE threshold, a SE fault operation interrupt command is generated and sent along with at least one command action via the controller interface 194 to the controller 195. Upon the controller 195 receiving the interrupt command and that at least one command action, the controller 195 stops the PSH-type IM 101 operation, and outputs the at least one command action thru the communication network 190 based on the interrupt command.

The anomaly databased can include a stored set of different levels of SE faults, and for each stored level of SE fault in the set of different levels of SE faults includes an associated set of command actions. The associated set of command actions for each level can be different, such that at a lower level of SE Fault may include command actions related a lesser degree of commant actions versus a higher degree of command actions, in terms of an amount of operation inspections, maintenance and/or management, work that may need to be completed. The types of command actions may include one or a combination of a level of operation inspection command from a set of level of operation inspections, a type of repair action from a set of repair actions, a type of operational design action from a set of operational design actions, a type of maintenance action from a set of maintenance actions, a type of management action from a set of management actions, etc.

Still referring to FIG. 1A, FIG. 1B and FIG. 1C, in some other embodiments of the present disclosure, upon detecting the fault, the system 100 can interrupt the operation of the induction motor 101 for further inspection or repair. The system 100 have input/out interfaces 192 connecting the system 100 with other systems and devices. The input interface 192 is configured to accept measurements of a stator current during an operation of the induction motor 101. The output interface 192 is configured to output severity of the faults in the induction motor 101. The system 100 includes the processor 120 configured to execute stored instructions, as well as a memory 140 that stores instructions that are executable by the processor. The processor 120 can be a single core processor, a multi-core processor, a computing cluster, or any number of other configurations. The memory 140 can include random access memory (RAM), read only memory (ROM), flash memory, or any other suitable memory systems. The processor 120 is connected through the bus 126 to the input/output devices 192, which is connect to other devices 193. The other devices 193 can be devices associated with assisting in the operation, maintenance and management of the system. Instructions can be implemented for detecting and/or classifying an anomaly in the operation of the induction motor 101 using one or a combination of the processor 120, the controller interfaces 190 and one or more controllers 195.

Figure 2B:
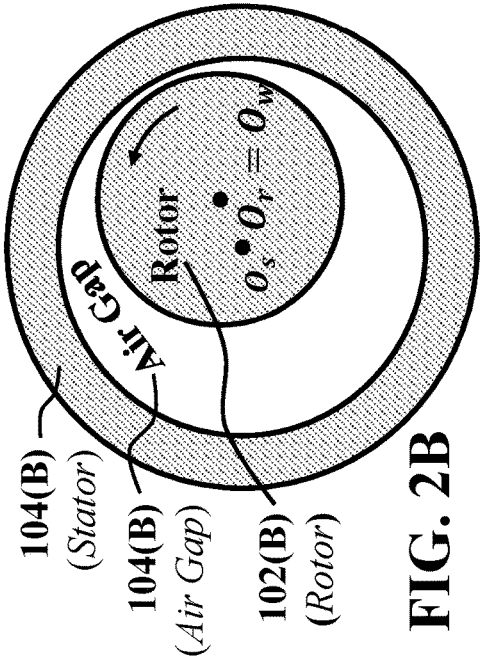
FIG. 2A, FIG. 2B, FIG. 2C and FIG. 2D are schematics illustrating diagrams of different types of eccentricity fault.
Figure 2D:
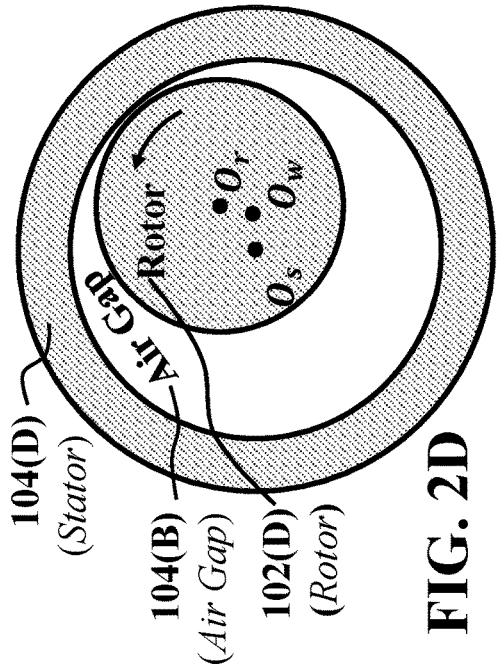
Figure 2A:
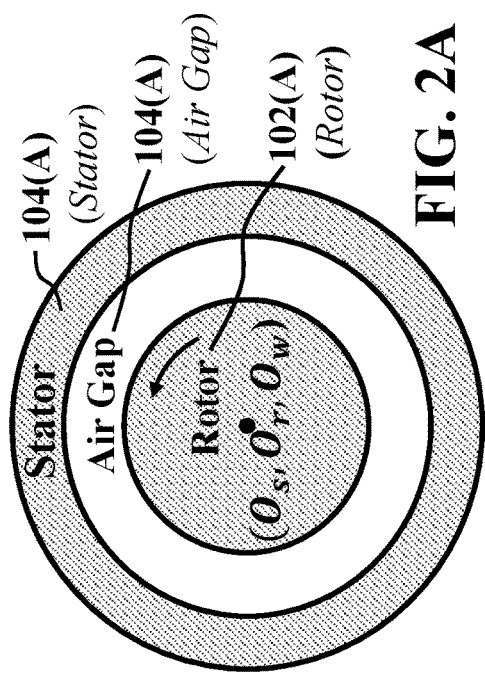
Figure 2C:
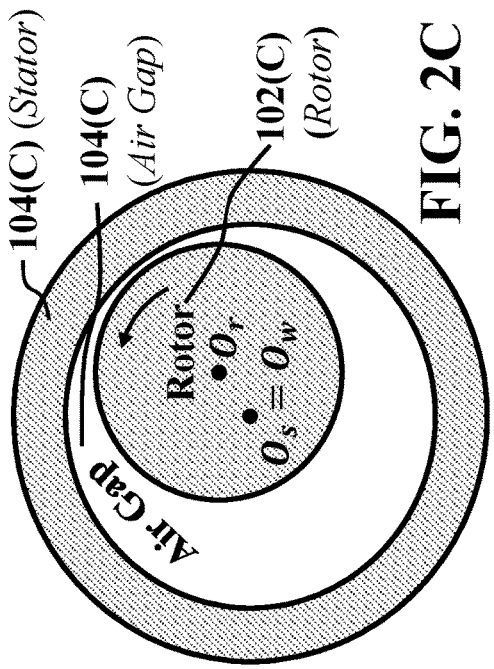

FIG. 2A to FIG. 2D are schematics illustrating diagrams of different types of eccentricity fault, FIG. 2A shows an induction motor that is healthy, FIG. 2B shows a static eccentricity (SE) fault, FIG. 2C shows a dynamic eccentricity (DE) fault and FIG. 2D shows mixed eccentricity (ME), according to some embodiments of the present disclosure. Wherein, eccentricity is a type of motor fault caused by the formation of unequal air gap between the stator bore and the rotor. Such that there are three types of motor eccentricity fault: the static eccentricity, the dynamic eccentricity, and the mixed eccentricity.

FIG. 2A is a schematic illustrating a point Ow that is a center of rotation, Os is a center of a stator bore, and Or is a center of rotor. When the three points coincide, the motor is healthy, meaning there is no eccentricity fault.

FIG. 2B is a schematic illustrating a case of static eccentricity, the points Or and Ow coincide, but are having an offset from the center of the stator bore Os. Since the rotor always rotates around the center point Ow, a static eccentricity fault is present, and the air gap 104(B) is not uniform at different locations.

FIG. 2C is a schematic illustrating when under dynamic eccentricity fault, the rotor's center of rotation Ow is aligned with the stator center Os, but the rotor center Or is orbiting around the point Ow. Since the rotor is not rotating around th its own center of mass, the air gap length 104(C) will vary depending on the rotation angle of the rotor, and change dynamically.

FIG. 2D is a schematic illustrating mixture of both static and dynamic eccentricity which is called mixed eccentricity, where the points Or, Os, and Or are not aligned with each other. In this case, both static eccentricity fault and dynamic eccentricity fault exist.

Typically static eccentricity of motors are created during the manufacturing process. Detection of static eccentricity fault at an early stage is essential, as it can evolve into mixed eccentricity over the motor's operation due to the unbalanced magnetic pull, and finally leads to a breakdown of the machine.

FIG. 3 is a table illustrating a categorization of the induction motors and its impact on the SE fault detection, as well as a major difference between conventional approaches and the approach analysis of the present disclosure, according to some embodiments of the present disclosure.

There are three groups of induction motor categorization. The group I of induction motors have motor parameters satisfying $R=2p[3(m\pm q)\pm r]\pm 1$, where $(m\pm q)=1, 2, \ldots$ and $r=0$ or 1. For example, a motor with 2 pole pairs and 29 rotor bars belongs to this category. Under this condition, the static eccentricity fault signature signal is located at the primary principle slot harmonic (PSH) frequency, and the signature signal has linear dependency on the level of static eccentricity.

The group II of induction motors have motor parameters satisfying $$R=2p[3(m\pm q)\pm r]\pm 2,$$

where $(m\pm q)=1, 2, \ldots$ and $r=0$ or 1. For example, a motor with 2 pole pairs and 30 rotor bars belongs to this category. In this case, the static eccentricity fault signature signal is also located at the primary PSH frequency, and the signature signal has a quadratic dependency on the level of static eccentricity.

The group III of induction motors 504c have motor parameters satisfying $$R=2p[3(m\pm q)\pm r],$$

where $(m\pm q)=1, 2, \ldots$ and $r=0$ or 1. For example, a motor with 2 pole pairs and 28 rotor bars belongs to this category. In this case, in prior arts that only considered the first-order harmonics of the air gap permeance function, no specific fault signal can be found to indicate the static eccentricity fault. In our finding, we realize that the static eccentricity fault signature signal is also located at the secondary PSH frequency, and the signature signal has a polynomial dependency on the level of static eccentricity, which is a relatively small signal.

Figure 4:
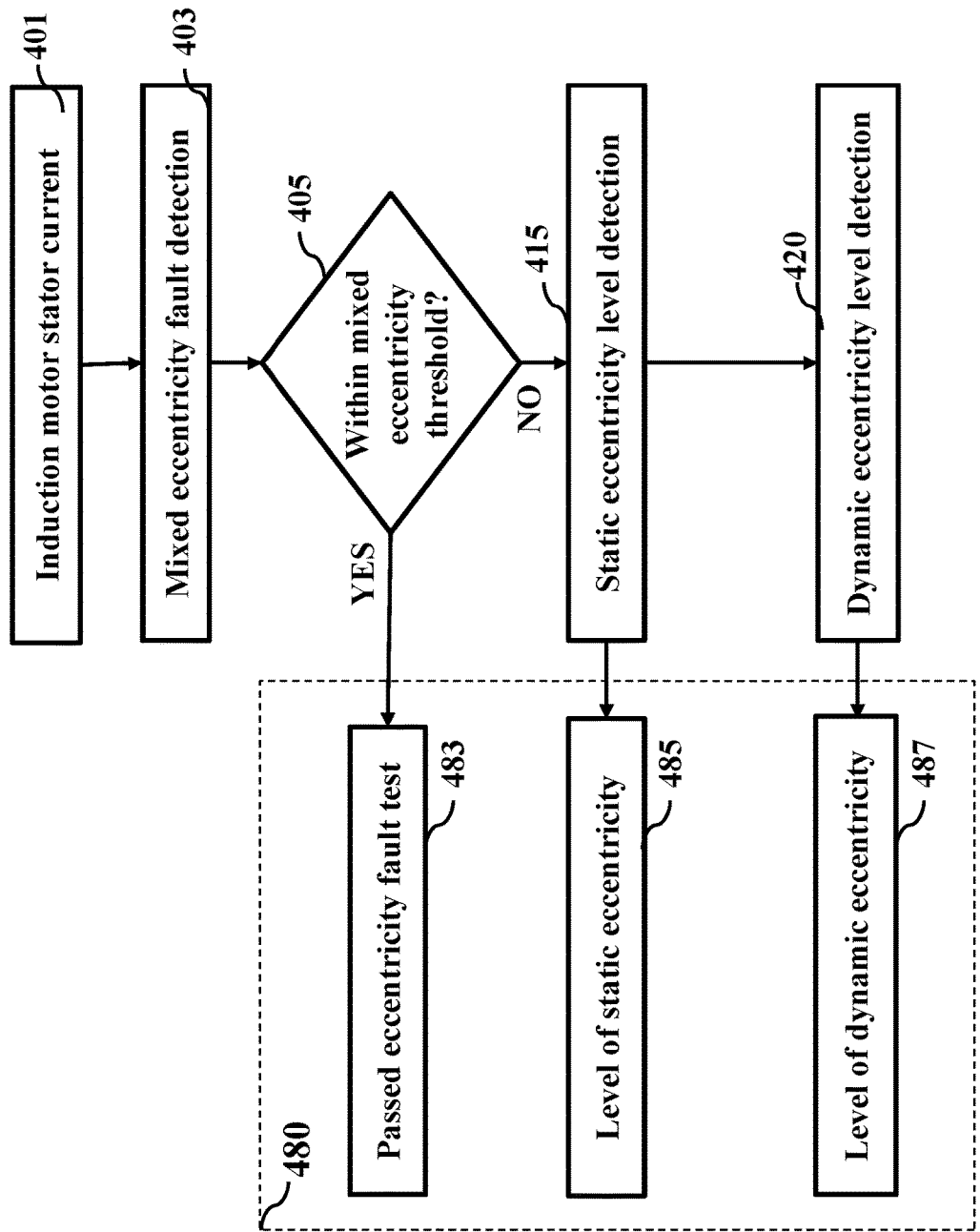
FIG. 4 is a flow diagram illustrating of eccentricity fault detection for induction motors, according to some embodiments of the present disclosure.

FIG. 4 is a flow diagram illustrating of eccentricity fault detection for induction motors, according to some embodiments of the present disclosure. For example, FIG. 4 shows a flow chart for the eccentricity fault detection process in the system 100 of FIG. 1C. The induction motor stator current 401 are measured by the sensors 105 and are collected by the input interface 110, and enters the system 100. The signal is first used to detect the level of mixed eccentricity with algorithm 403. The level of mixed eccentricity is compared with a mixed eccentricity threshold in step 405.

The system outputs eccentricity fault detection results 480, including results of a healthy motor 483, static eccentricity level 485 and static eccentricity level 487. For example, if a level of mixed eccentricity is within the threshold, the motor passes the eccentricity fault test in the manufacturing phase, and can be categorized as a healthy motor 483. If the level of mixed eccentricity is beyond mixed eccentricity, further tests are needed to identify the level of static and dynamic eccentricity. The system 415 detects the motor's static eccentricity level, and the algorithm 415 output the resultant static eccentricity level 485. The system 420 detects the motor's dynamic eccentricity level, and the algorithm 420 output the resultant static eccentricity level 487. The system finally output the eccentricity fault detection result 480, which is a collection of 483, 485, and 487.

The quantitative eccentricity fault detection for induction motor algorithm depends on the structure of the induction motor, such that diagrams of induction motors and a further discussion of the categorization for the induction motors is explained in FIG. 5A, FIG. 5B, FIG. 5C and FIG. 5D.

Figure 5B:
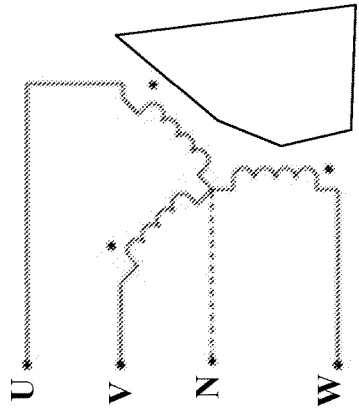
FIG. 5B is a schematic illustrating a Y-connection diagram for the windings, according to some embodiments of the present disclosure.
Figure 5A:
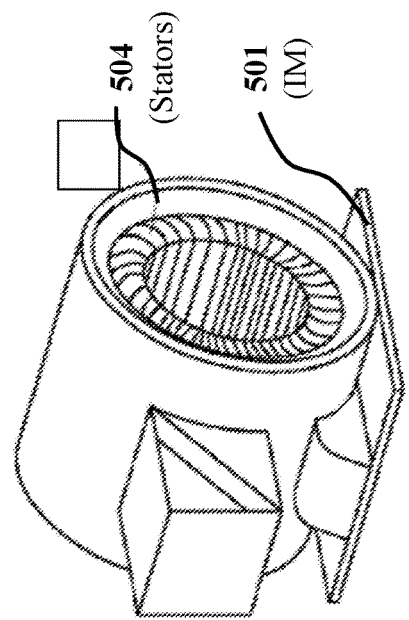
FIG. 5A is a schematic illustrating a stator in a squirrel cage type induction motor, according to some embodiments of the present disclosure.

FIG. 5A is a schematic illustrating a stator in a squirrel cage type induction motor, according to some embodiments of the present disclosure. For example, the induction motor 501 includes a stator 504 with multi-phase windings.

FIG. 5B is a schematic illustrating a Y-connection diagram for stator windings (not shown) of FIG. 5A, according to some embodiments of the present disclosure. For example, the stator windings are three phase, and FIG. 5B depicts three-phase windings. Further, it is possible that some special motors can have number of phases more than three.

Figure 5D:
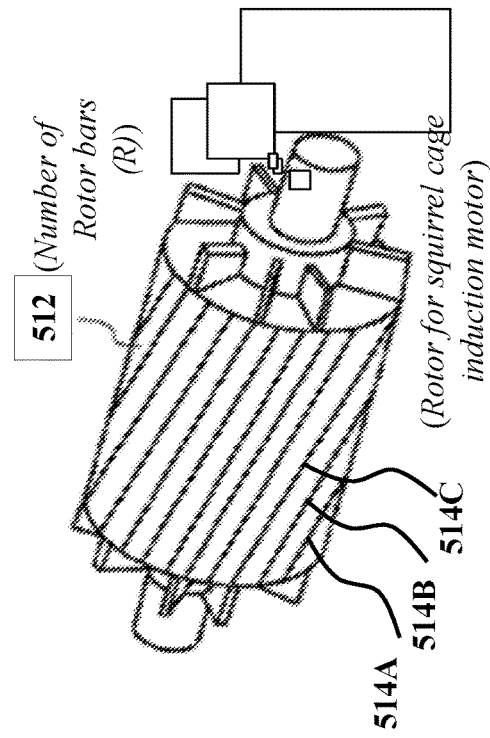
FIG. 5D is a schematic illustrating a rotor in a squirrel cage induction motor with rotor bars, according to some embodiments of the present disclosure.
Figure 5C:
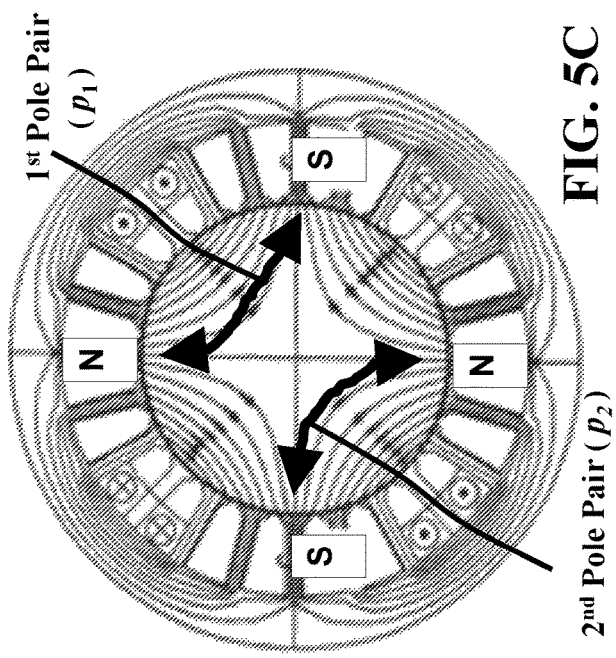
FIG. 5C is a schematic illustrating magnetic poles generated by the windings, according to some embodiments of the present disclosure.

FIG. 5C is a schematic illustrating magnetic poles generated by the windings, according to some embodiments of the present disclosure. For example, the stator of FIG. 5A generates a magnetic field in the motor. Wherein, a diagram for the magnetic flux distribution in the induction motor 501 of FIG. 5A has two pole pair, a first pole pair (p1) and a second pole pair (p2). The induction motor 501 of FIG. 5A has a rotor (not shown), which is a squirrel cage structure.

FIG. 5D is a schematic illustrating a rotor in a squirrel cage induction motor with rotor bars, according to some embodiments of the present disclosure. For example, the rotor 512 has a number of rotor bars 514A, 514B, 514C. The number of stator pole pair can be expressed at p (i.e. p1, p2, etc.), and the number of rotor bars as R (i.e. R1, R2, etc.). These numbers are important for induction motor design parameters, and are used for motor categorization. Motors with different structures use different eccentricity fault detection methods.

Figure 6:
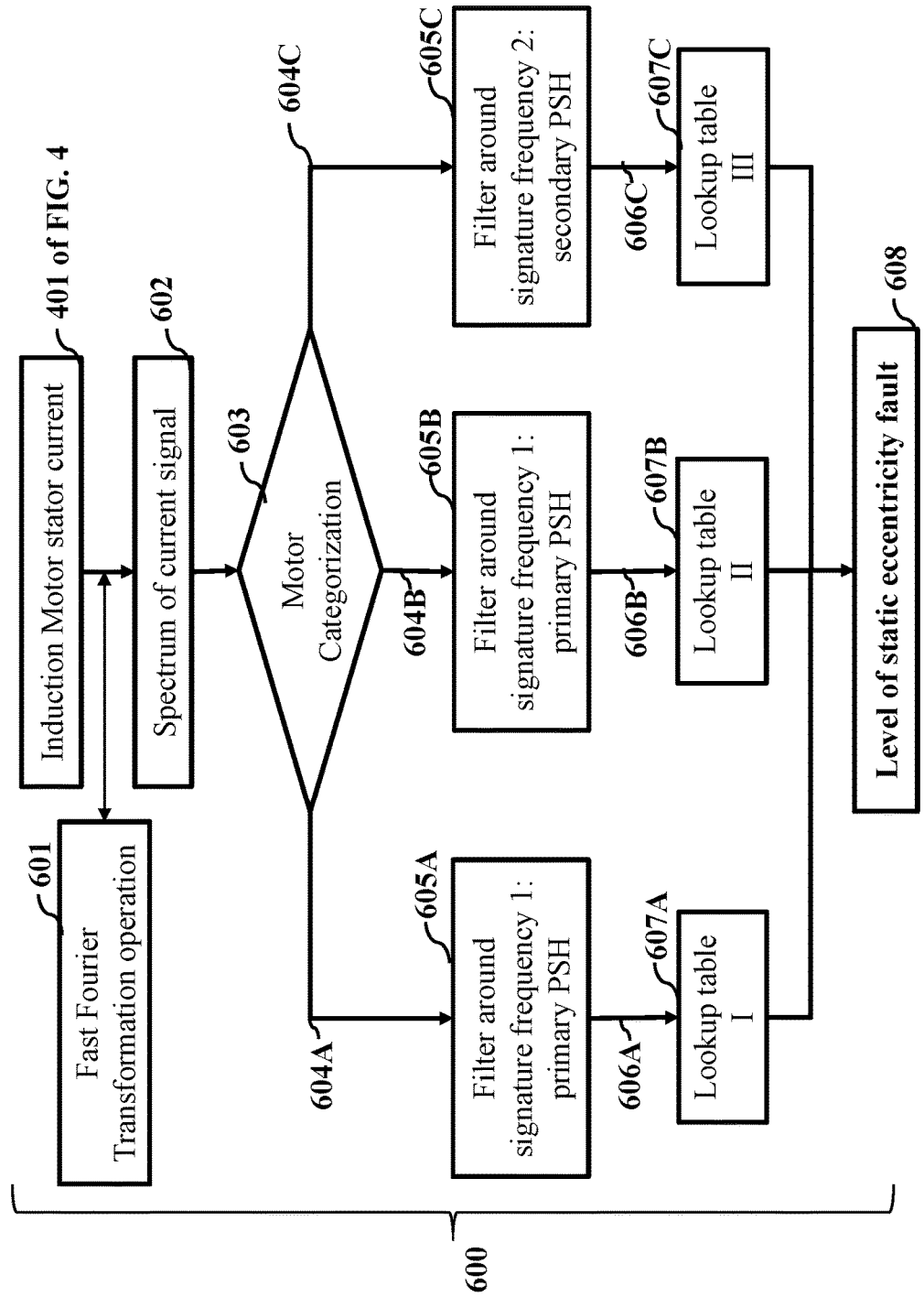
FIG. 6 is a flow diagram illustrating static eccentricity fault detection, according to some embodiments of the present disclosure.

FIG. 6 shows a flow chart for the static eccentricity fault detection method 415 of FIG. 4 for induction motors. In this test, the measured induction motor stator current signals 401 of FIG. 4 is being used. The Fast Fourier Transformation operation 601 is used to calculate the spectrum of the current signal 602. The static eccentricity level detection method depends on the motor's structure. There are three groups of induction motor categorization 604A, 604B, 604C, and step 603 categorizes the motor into one of the three groups The group I of induction motors 604A have motor parameters satisfying $$R=2p[3(m\pm q)\pm r]\pm 1,$$

where $(m\pm q)=1, 2, \ldots$ and $r=0$ or 1. For example, a motor with 2 pole pairs and 29 rotor bars belongs to this category. Under this condition, the static eccentricity fault signature signal is located at the primary principle slot harmonic (PSH) frequency, and the signature signal has linear dependency on the level of static eccentricity. The signals are filtered around the primary PSH signal in step 605A a, and the resultant signal 606A is compared with a pre-computed lookup table I in 607A to find the level of static eccentricity 608.

The group II of induction motors 604B have motor parameters satisfying $$R=2p[3(m\pm q)\pm r]\pm 2,$$

where $(m\pm q)=1, 2, \ldots$ and $r=0$ or 1. For example, a motor with 2 pole pairs and 30 rotor bars belongs to this category. In this case, the static eccentricity fault signature signal is also located at the primary PSH frequency, and the signature signal has a quadratic dependency on the level of static eccentricity. The signals are filtered around the primary PSH signal in step 605B, and the resultant signal 606B is compared with a pre-computed lookup table II 607B to find the level of static eccentricity 608.

The group III of induction motors 604C have motor parameters satisfying $$R=2p[3(m\pm q)\pm r],$$

where $(m\pm q)=1, 2, \ldots$ and $r=0$ or 1. For example, a motor with 2 pole pairs and 28 rotor bars belongs to this category. In this case, the static eccentricity fault signature signal is also located at the secondary PSH frequency, and the signature signal has a polynomial dependency on the level of static eccentricity, which is a relatively small signal. The signals are filtered around the secondary PSH signal in step 605C, and the resultant signal 606C is compared with a pre-computed lookup table II 607C to find the level of static eccentricity 608. With this method, the level of static eccentricity 608 can be detected for all categories of motors.

FIG. 7A and FIG. 7B are graph illustrating air gap length and air gap permeance as functions of mechanical angle under varying static eccentricity, according to some embodiments of the present disclosure. When there is no eccentricity fault, the air gap profile is uniform at different stator angle. The air gap variation occurs with static eccentricity fault, and the variation amplitude increases with higher fault level. The air gap permeance function, as shown in FIG. 7B, is inversely proportional to the air gap length, as shown in FIG. 7A.

Figure 7C:
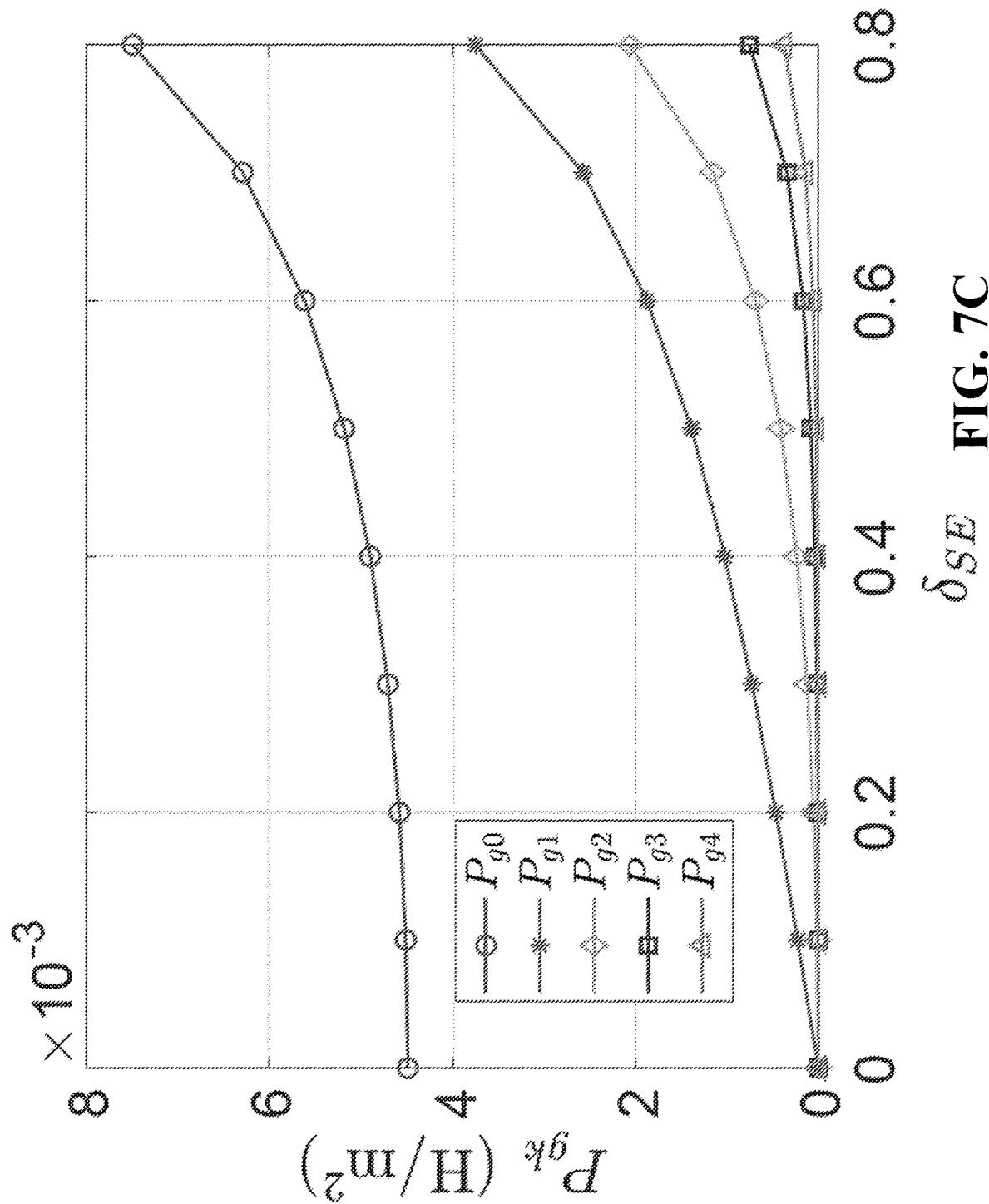
FIG. 7C is a graph illustrating values of first four Fourier coefficients of air gap permeance under varying static eccentricity levels, according to some embodiments of the present disclosure.

FIG. 7C is a graph illustrating values of first four Fourier coefficients of air gap permeance under varying static eccentricity levels, according to some embodiments of the present disclosure; When there is no eccentricity fault, only fundamental harmonic is present. When there is static eccentricity fault, higher order harmonics present. The amplitude of the second-order harmonic becomes significant, especially at higher eccentricity fault level. Wherein, this term and higher harmonics were neglected in the analysis in prior arts.

FIG. 8 is a table illustrating parameters of an evaluated PSH-type induction motor, according to some embodiments of the present disclosure. The motor belongs to group III of induction motors 604C of FIG. 6 have motor parameters satisfying $$R=2p[3(m\pm q)\pm r],$$

where $(m\pm q)=1, 2, \ldots$ and $r=0$ or 1.

Figure 9A:
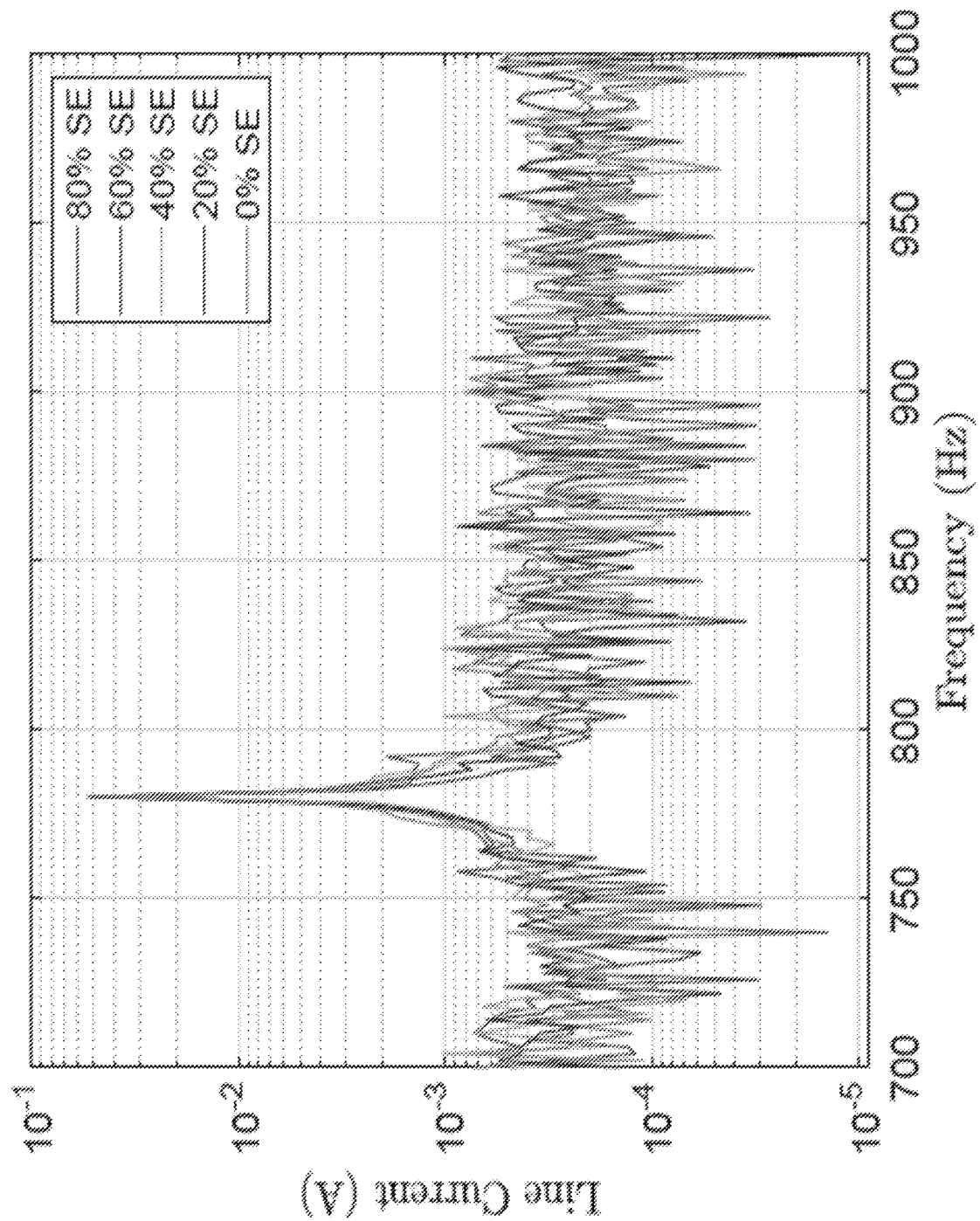
FIG. 9A and FIG. 9B are graphs illustrating a simulated current spectrum at 780 Hz and 900 Hz under varying SE levels, where FIG. 9A data uses the air gap permeance model I, and FIG. 9B data uses the air gap permeance model II, according to some embodiments of the present disclosure.
Figure 9B:
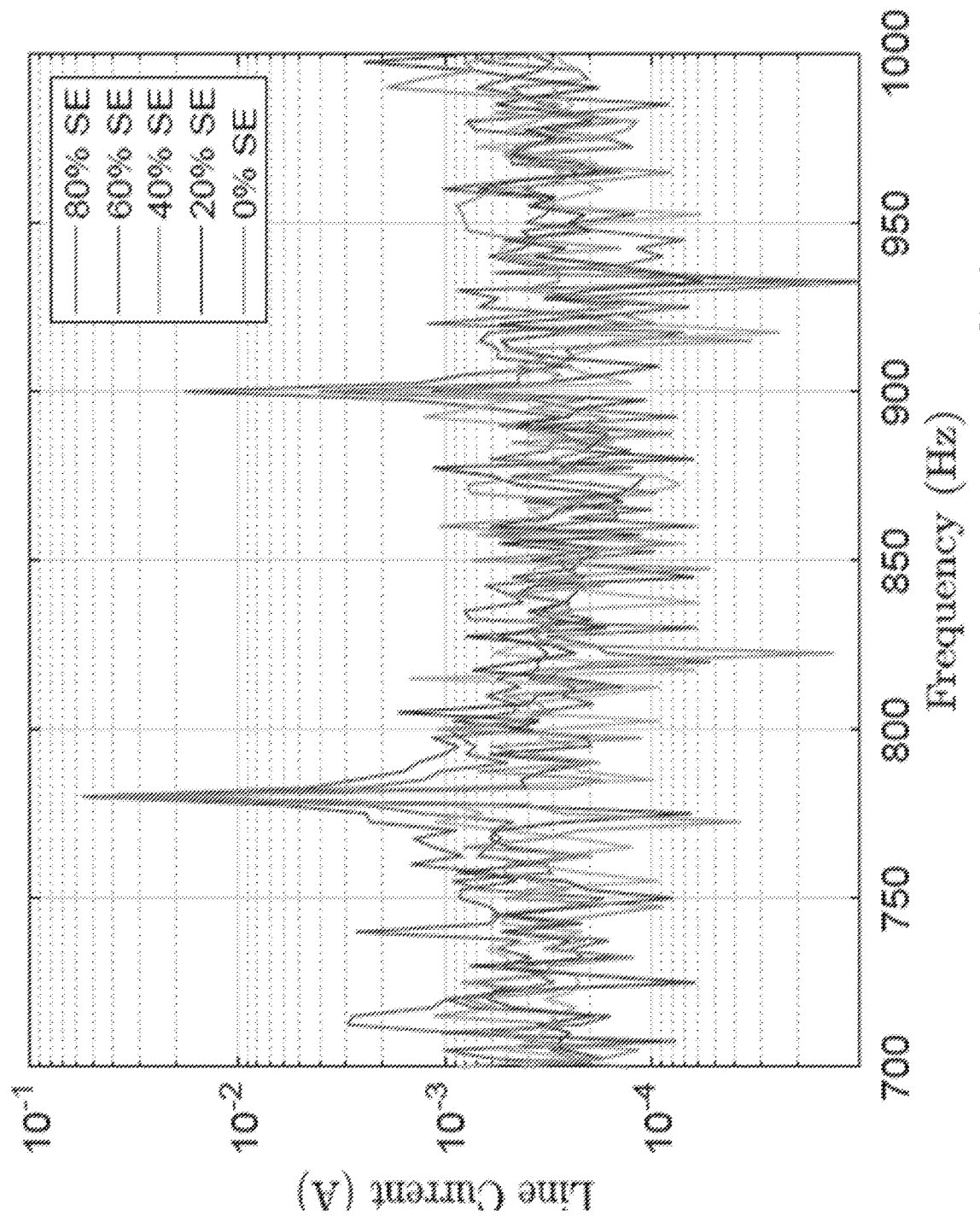

FIG. 9A and FIG. 9B are graphs illustrating a simulated current spectrum at 780 Hz and 900 Hz under varying SE levels, where FIG. 9A data uses the air gap permeance model I 604A of FIG. 6, and FIG. 9B data uses the air gap permeance model II 604B of FIG. 6, according to some embodiments of the present disclosure. The motor being studied belongs to the PSH-type motors 605C of FIG. 6, and under this case the secondary PSH current signal (900 Hz for this motor) is used for static eccentricity fault detection. The data in FIG. 7B are used for the lookup table III 607C of FIG. 6.

Figure 10A:
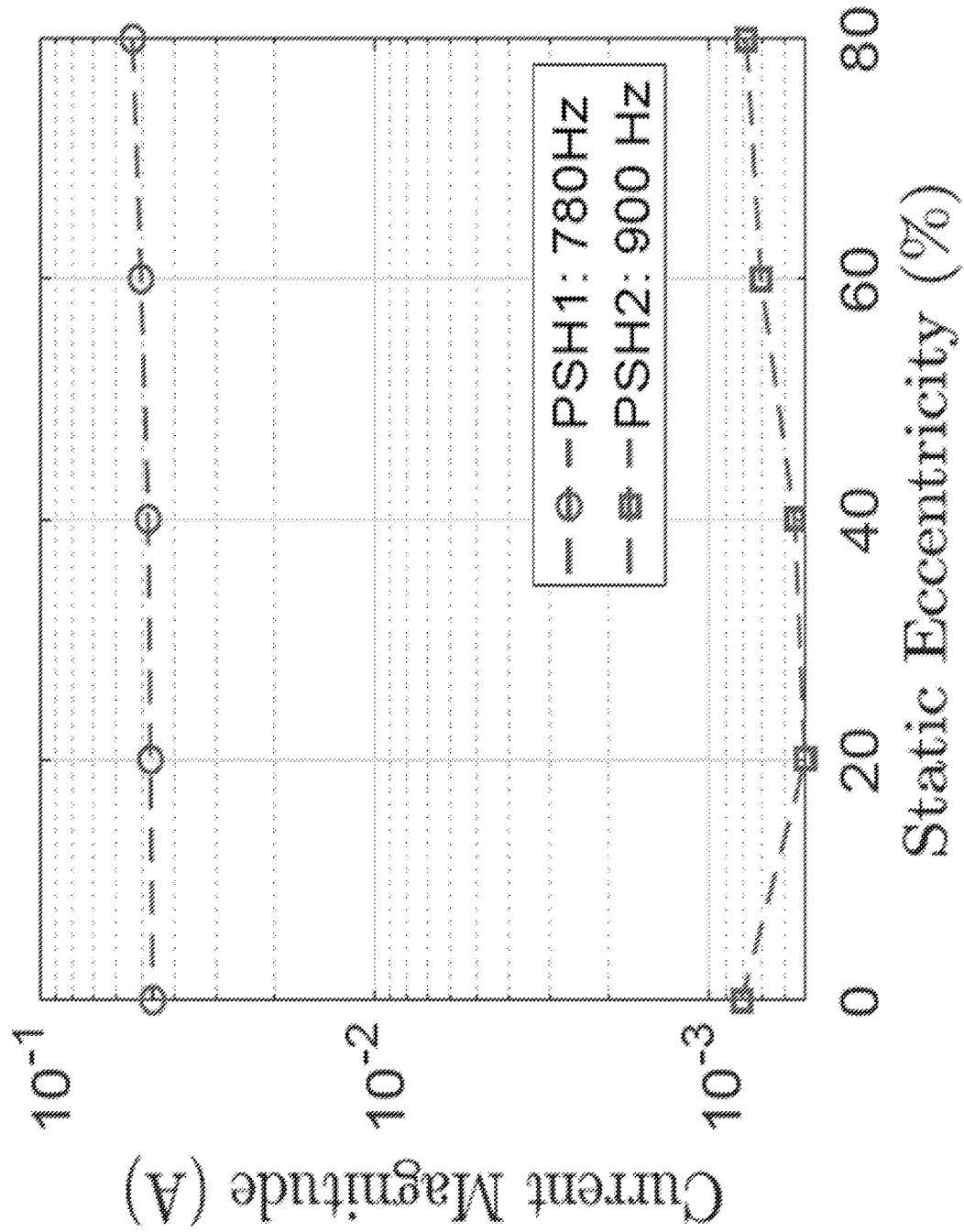
FIG. 10A and FIG. 10B are graphs illustrating the amplitude of the PSH signals with respect to eccentricity level.
Figure 10B:
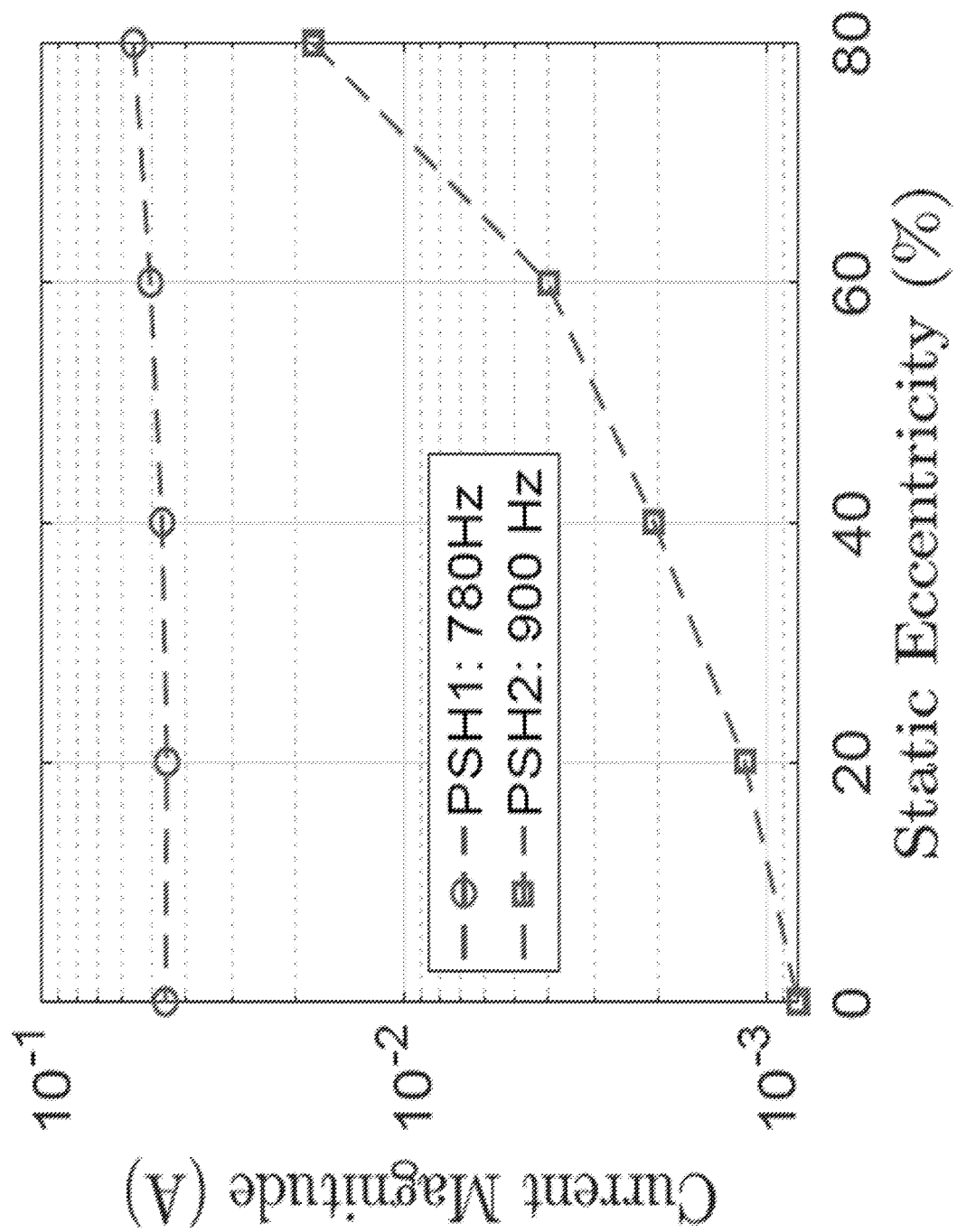

FIG. 10A and FIG. 10B are graphs illustrating the amplitude of the PSH signals with respect to eccentricity level, FIG. 10A illustrates the air gap permeance model I 604A of FIG. 6, and FIG. 10B shows the air gap permeance model II 604B of FIG. 6, according to some embodiments of the present disclosure. FIG. 10A is obtained with the conventional method where the second-order harmonic of the air gap permeance function is neglected. It is shown that at PSH2 frequency, the amplitude of the signal remains low for different eccentricity levels. FIG. 10B is obtained with the second-order harmonic of the air gap permeance function included in the calculation. It is shown that at PSH2 frequency, the amplitude of the signal increases significantly with increasing eccentricity level. Therefore, the PSH2 signal can be used as an indicator of the static eccentricity fault of the motor.

Figures 11A, 11B:
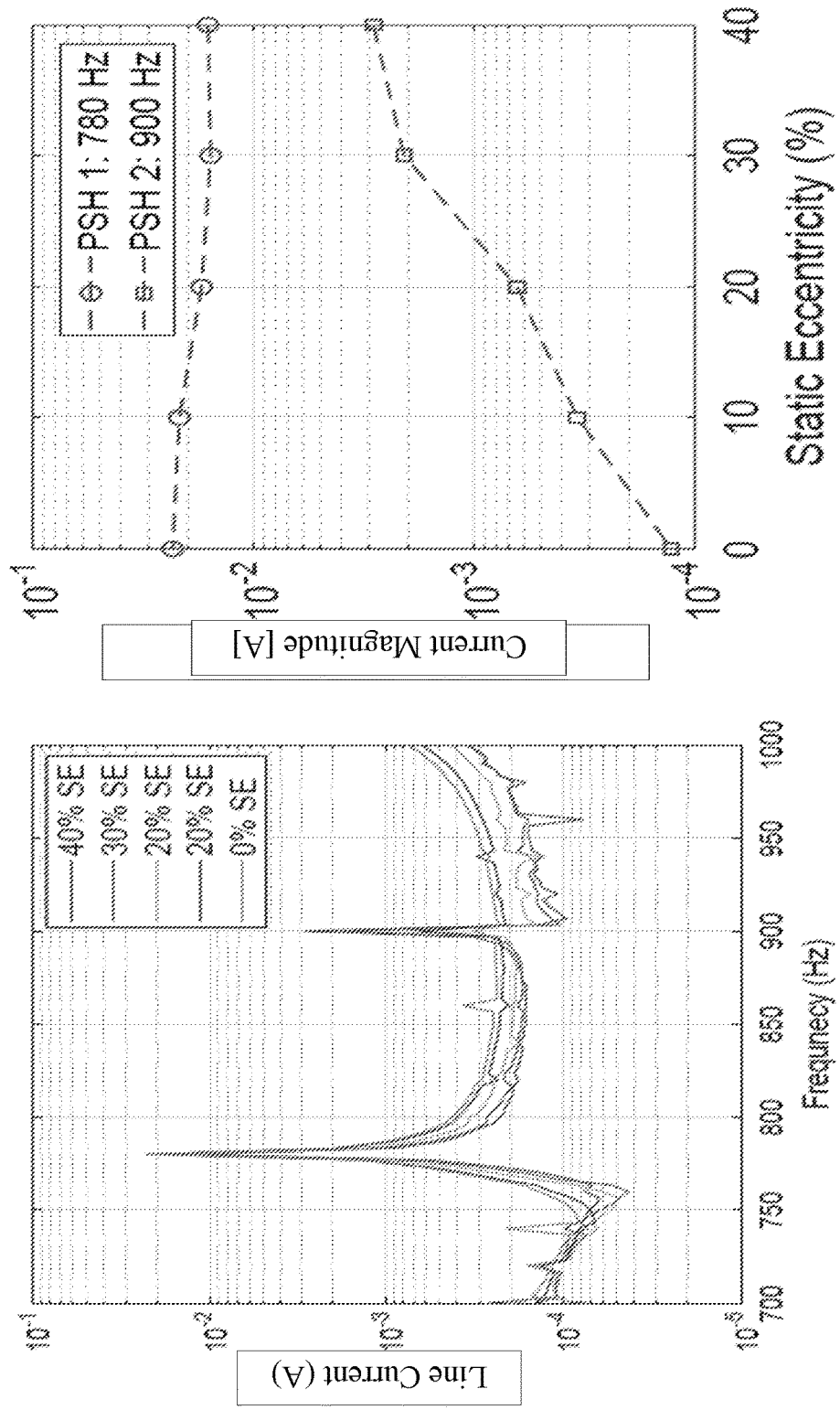
FIG. 11A and FIG. 11B are graphs illustrating a FEM simulated phase u line current around the PSH signals, where

FIG. 11A and FIG. 11B are graphs illustrating a FEM simulated phase u line current around the PSH signals, where FIG. 11A illustrates the current spectrum, and FIG. 11B shows the current magnitude of the two PSH frequencies, according to some embodiments of the present disclosure. It can be observed that FEM-simulated motor line current has peaks appearing at both 780 Hz and 900 Hz as expected. The magnitude of the 900 Hz signal is positively correlated to the level of static eccentricity, which resembles the signal shown in FIG. 10B. This observation validates the analytical model for induction motor considering the higher-order harmonics of air gap permeance, and also confirms that the secondary PSH current signal (at 900 Hz for the motor being evaluated) can be used for static eccentricity detection.

Figure 12A:
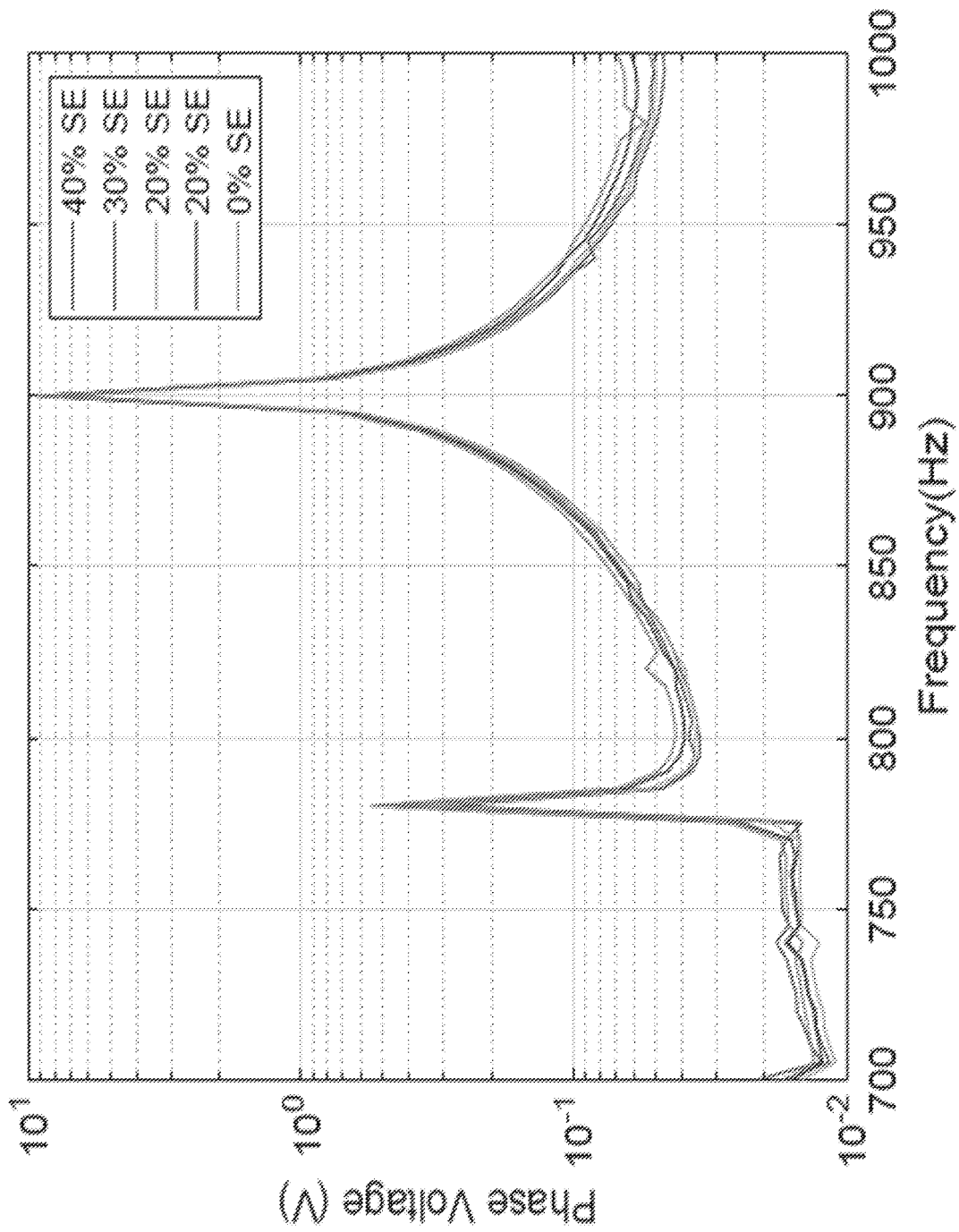
FIG. 12A and FIG. 12B are graphs illustrating FEM simulated motor induced voltage signals under varying static eccentricity levels, where
Figure 12B:
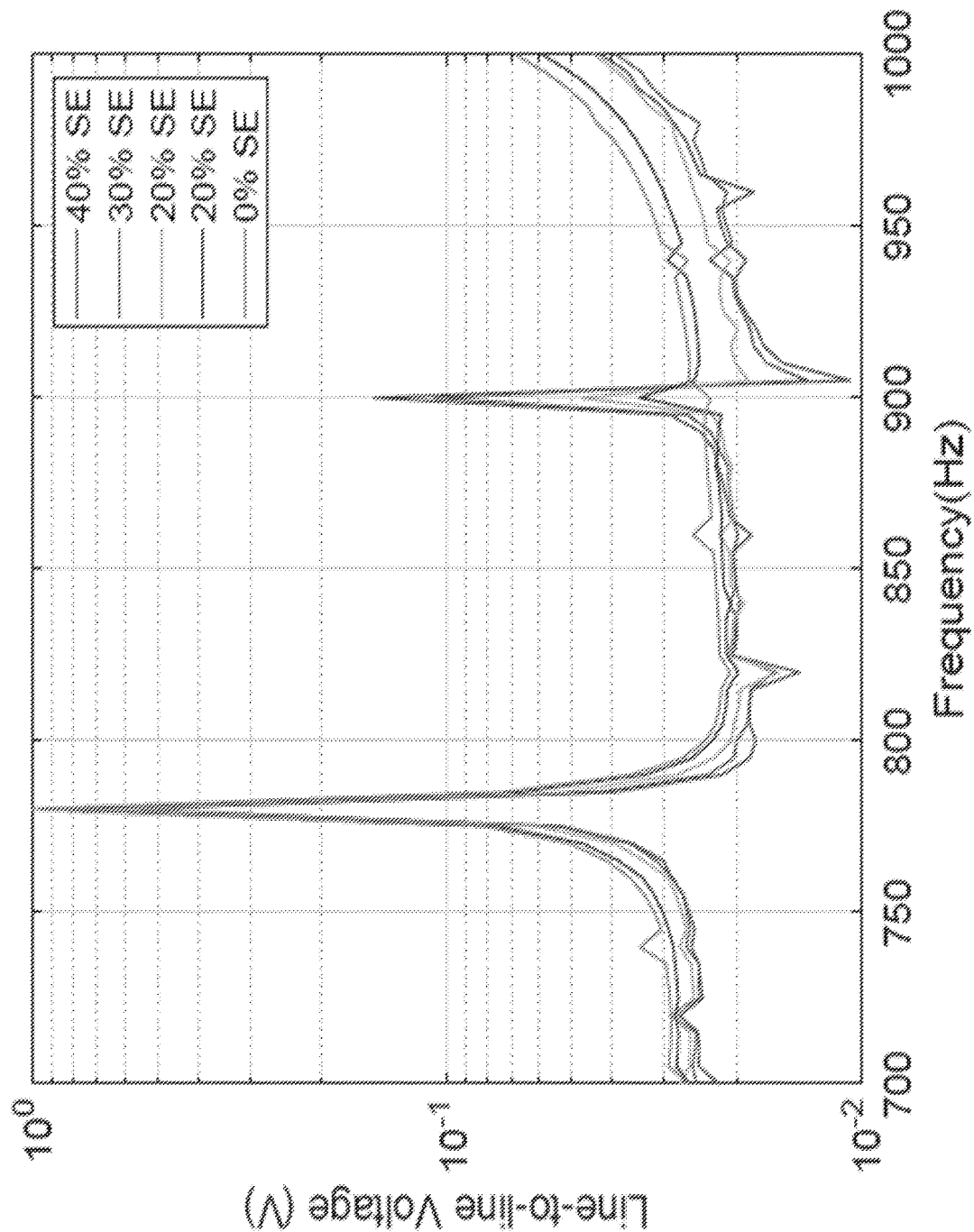

FIG. 12A and FIG. 12B are graphs illustrating FEM simulated motor induced voltage signals under varying static eccentricity levels, where FIG. 12A illustrates a phase A voltage, and FIG. 12B shows line-to-line voltage between phase A and phase B, according to some embodiments of the present disclosure. The 900 Hz voltage has a large amplitude in the single-phase voltage in FIG. 12A, and is having a relatively small amplitude in the line-to-line voltage in FIG. 12B. This is because the 900 Hz voltage is primarily zero-sequence due to both slot harmonics and the 15th harmonic of supply, which agrees with our analysis. The amplitude of the line-to-line voltage at 900 Hz varies with the static eccentricity level, which generates the static eccentricity-dependent line current signal shown in FIG. 11.

Figure 13:
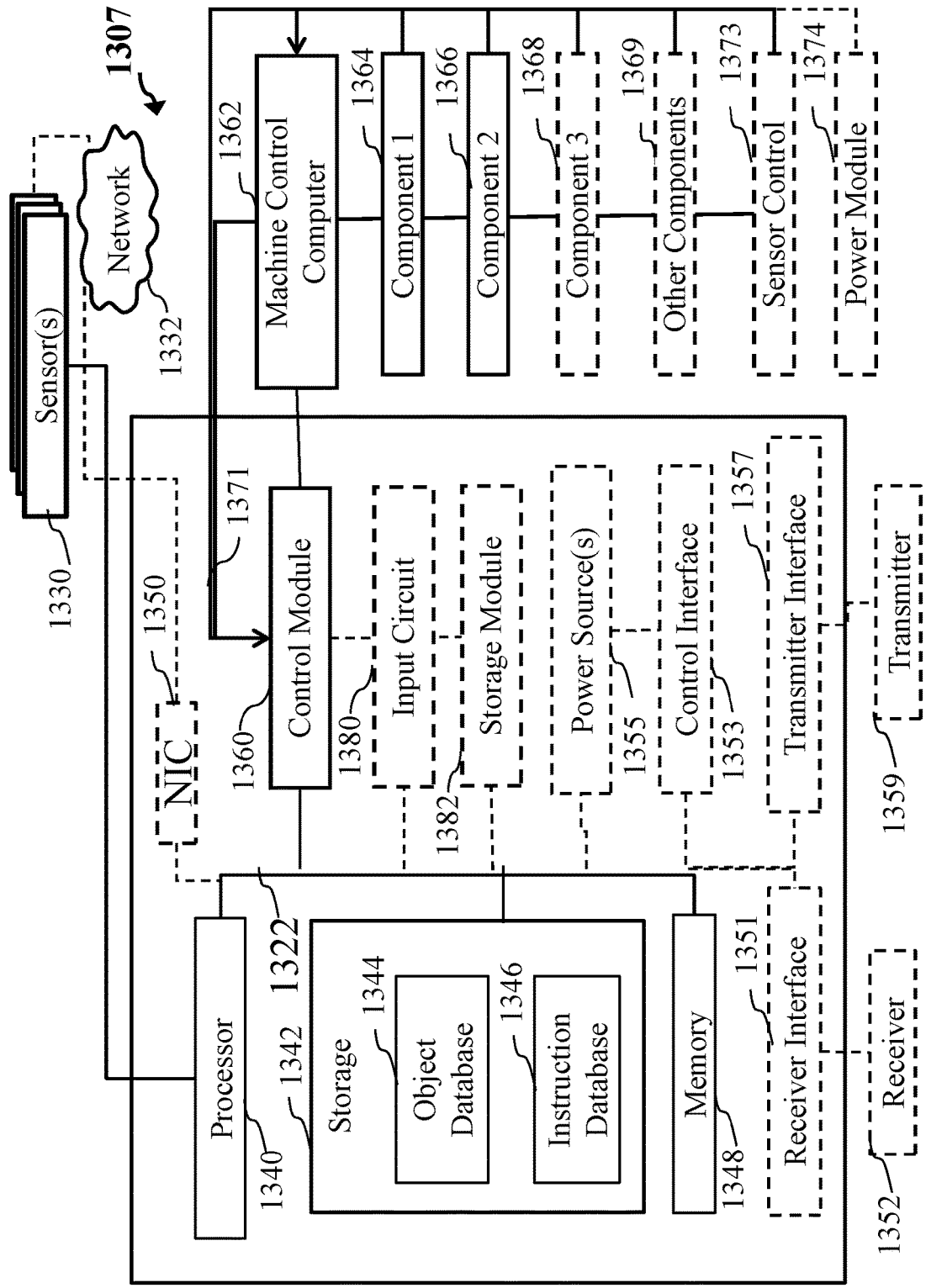
FIG. 13 is a schematic diagram illustrating some components for a processor in communication with a controller system of a machine including an induction motor, according to some embodiments of the present disclosure.

FIG. 13 is a schematic diagram illustrating some components for a computing system 1307 having a processor 1340 connected to a control system 1362 of a machine (not shown), such as a PM machine or similar type of machine, according to some embodiments of the present disclosure. For example, the processor 1340 can be located approximate the machine (not shown) or within the machine. The processor 1340 can be connected to sensors 1330 located within an environment (not shown) and positioned within a sensing distance of the processor 1240 and the machine (not shown). The sensors 1330 can be cameras, video cameras, speed sensors, light sensors, environmental related sensors (i.e. temperature, humidity, fire, air, water, barometer sensors, etc.), used with the machine (not shown). The sensors 3330 can be hardwired and/or wireless, such that a network 1332 can be within an operating distance range of the sensors 1330.

The processor 1340 is connected to a bus system 1322 that connects to storage 1342. The storage 1342 can include a database 1344, an instruction database 1346, an historical database (not shown), an instruction historical database (not shown), an environmental database (not shown), a machine database (not shown) associated with the operation of the machine, other databases (not shown) can have data related to operation and information usable for optimizing, managing or operating the machine (not shown). Again, depending upon each user/operator's specific operational configurations/structure/special needs/sensitivities of the intended use of the machine, many different configurations are contemplated.

Still referring to FIG. 13, a memory 1348 is connected to the bus system 1322, along with a receiver interface(s) 1351, a receiver(s) 1352 and a power source(s) 1355. The power source(s) 1355 can be connected to the bus system 1322, connected to a control interface 1353, or be configure to have a multitude of other configurations, all of which, is contemplated depending on the specific user/operator intended specific needs for operations. It is possible the power source(s) can be electric, renewable energy sources, chemical, as well as directly connected to the machine, have a multiple external power sources of different types, or both. A transmitter interface(s) 1357 and transmitter(s) 1359 are connected to the bus system 1322. Also, a network interface controller 1350 (NIC, also known as a network interface card, network adapter, LAN adapter or physical network interface, and by similar terms, is a computer hardware component connecting a computer to a computer network) is connected to the bus system 1322 and can be in communication with a network 1332 or other different types of wireless networks (not shown). Again, depending upon the special needs for operation & sensitives needed by a user/operator for their intended use.

A control module(s) 1360 can be connected to the bus system 1322. The control module(s) 1360 can be connected to a machine control computer(s) 1362, that assist in directing components of the machine control computer 1362. Some components can include, by non-limiting example, component 1 1364, component 2 1366, component 3 1368, and other machine related components 1369, which all can be connected to the machine control computer(s) 1362, and/or the control module 1360, via 1371. The control Module 1360 can be configured from the machine control computer 1362 to check a machine component(s) status once, and report back, thereby providing management of the machine, operational optimization/performance along with other related service and monitoring capabilities. Contemplated is that the machine control computer can have a power module 1374, that can include any power source that provides power to the machine (not shown) such as a power adaptor or a rechargeable battery pack depending on the user specific requirements.

Still referring to FIG. 13, the processor 1340 can implement or execute stored instructions that are stored in memory 1348, storage 1342 or access from a cloud storage via the network 1332, in particular, the processor 1340 can access the prestored data including data from the database 1344, the instruction database 1346, or other stored data from other databases (not shown), as noted above.

Still referring to FIG. 13, the machine control computer 1362 provide commands and implement changes to one or more components of the machine associated with aspects of the models of the present disclosure. Contemplated is that the computer system 1307 can include a sensor control 1373 connected to the components 1364, 1366, 1368 of the machine. Also contemplated is that some component sensors (i.e. sensors associated with the machine, or any other components of the machine or associated with components associated with the machine), and other components (not shown) can be utilized. Contemplated is that multiple types of sensors can be located on or in an approximate area of the machine.

The sensor control computer 1373 can include a hardware processor (not shown) connected a memory (not shown) that includes stored software (not shown). The hardware processor (not shown) can implement or execute stored instructions that are stored in memory (not shown), and when any sensor data is received, the received data can be compared to stored data, and send sensor data/signals, such warning messages, a level of performance associated with one or more components of the machine, etc., to the machine control computer 1362 or other components of the machine or computer system 1307. Another aspect of the systems and components of the present embodiments, is that software or hardware, or some combination thereof, can be implemented via localized storage or through a cloud-based system.

Further, the control or controller module 1360 can include different applications and programs for implementing methods of the present disclosure. For example, the control module 1360 can include applications for processing information received from the machine control computer 1362, such as generating graphs, operation related models including 3D models of the environment where the machine is located. The control module 1360 can include applications for interpreting control inputs, or input signals, received via the input circuit/interface module 1380, storage module 1382, and generating commands/actions.

Figure 14:
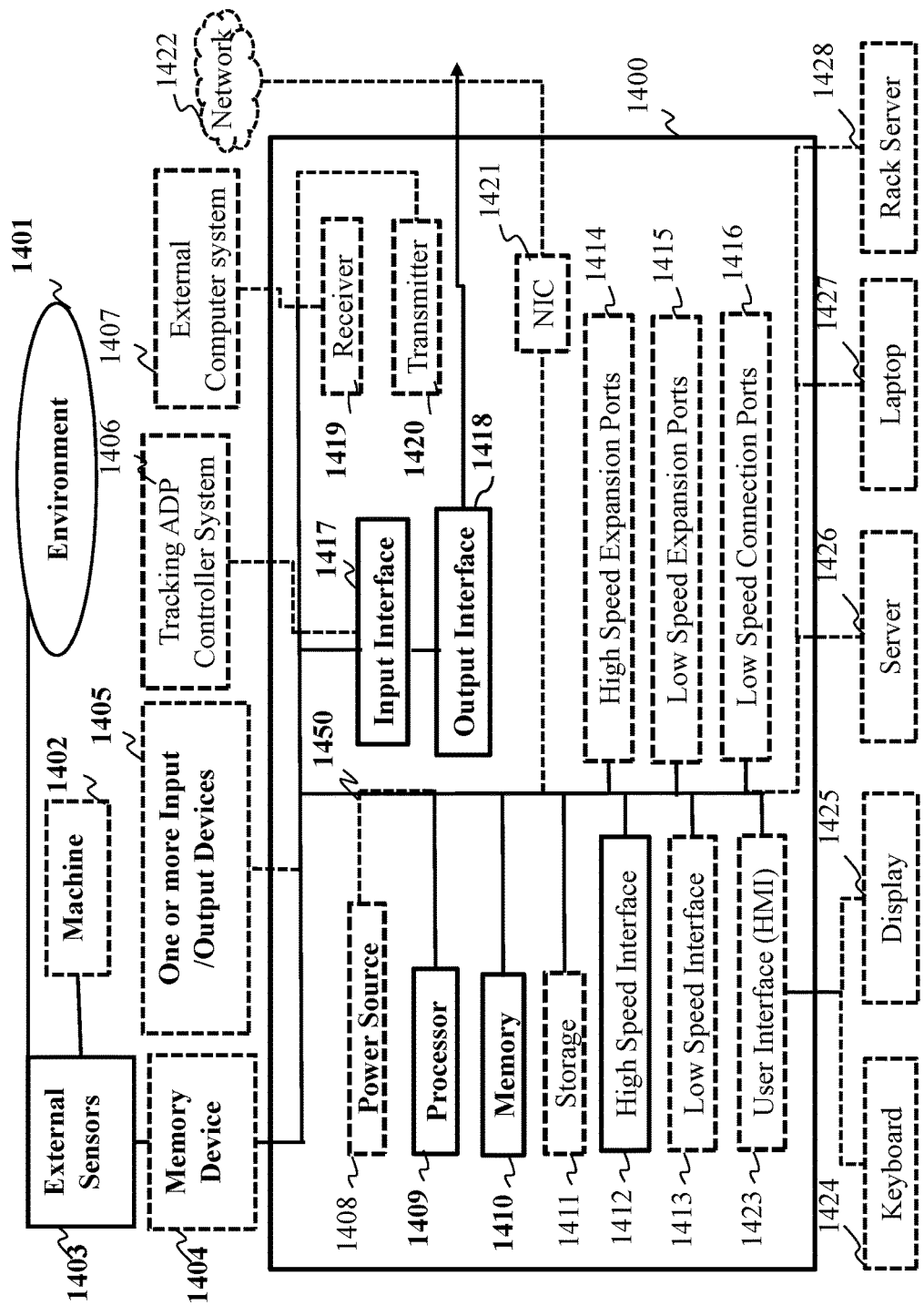
FIG. 14 is a schematic diagram illustrating a centralized controller system that can be used for implementing some systems and methods, according to some embodiments of the present disclosure.

FIG. 14 is a schematic diagram illustrating a centralized controller system that can be used for implementing some methods, or may be combined with the processor of FIG. 13, depending on the specific goals of a user, according to some embodiments of the present disclosure. For example, the centralized controller system can be a computing apparatus that represents various forms of digital computers, such as laptops, desktops, workstations, personal digital assistants, servers, blade servers, mainframes, and other appropriate computers.

The centralized controller system 1400 can include a power source 1408, a processor 1409, a memory 1410, a storage device 1411, all connected to a bus 1450. Further, a high-speed interface 1412, a low-speed interface 1413, high-speed expansion ports 1414 and low speed connection ports 1415, can be connected to the bus 1450. Also, a low-speed expansion port 1416 is in connection with the bus 1450. Contemplated are various component configurations that may be mounted on a common motherboard, by non-limiting example, 1430, depending upon the specific application. Further still, an input interface 1417 can be connected via bus 1450 to an external receiver 1406 and an output interface 1418. A receiver 1419 can be connected to an external transmitter 1407 and a transmitter 1420 via the bus 1450. Also connected to the bus 1450 can be an external memory 1404, external sensors 1403, machine(s) 1402 and an environment 1401. Further, one or more external input/output devices 1405 can be connected to the bus 1450. A network interface controller (NIC) 1421 can be adapted to connect through the bus 1450 to a network 1422, wherein data or other data, among other things, can be rendered on a third-party display device, third party imaging device, and/or third-party printing device outside of the computer device 1400.

Contemplated is that the memory 1410 can store instructions that are executable by the centralized controller system 1400, historical data, and any data that can be utilized by the methods and systems of the present disclosure. The memory 1410 can include random access memory (RAM), read only memory (ROM), flash memory, or any other suitable memory systems. The memory 1410 can be a volatile memory unit or units, and/or a non-volatile memory unit or units. The memory 1110 may also be another form of computer-readable medium, such as a magnetic or optical disk.

Still referring to FIG. 14, a storage device 1411 can be adapted to store supplementary data and/or software modules used by the computer device 1400. For example, the storage device 1411 can store historical data and other related data as mentioned above regarding the present disclosure. Additionally, or alternatively, the storage device 1411 can store historical data similar to data as mentioned above regarding the present disclosure. The storage device 1411 can include a hard drive, an optical drive, a thumbdrive, an array of drives, or any combinations thereof. Further, the storage device 1411 can contain a computer-readable medium, such as a floppy disk device, a hard disk device, an optical disk device, or a tape device, a flash memory or other similar solid-state memory device, or an array of devices, including devices in a storage area network or other configurations. Instructions can be stored in an information carrier. The instructions, when executed by one or more processing devices (for example, processor 1409), perform one or more methods, such as those described above.

The system can be linked through the bus 1450 optionally to a display interface or user Interface (HMI) 1423 adapted to connect the system to a display device 1425 and keyboard 1424, wherein the display device 1425 can include a computer monitor, camera, television, projector, or mobile device, among others.

Still referring to FIG. 14, the centralized controller system 1400 can include a user input interface 1417 adapted to a printer interface (not shown) can also be connected through bus 1450 and adapted to connect to a printing device (not shown), wherein the printing device can include a liquid inkjet printer, solid ink printer, large-scale commercial printer, thermal printer, UV printer, or dye-sublimation printer, among others.

The high-speed interface 1412 manages bandwidth-intensive operations for the computing device 1400, while the low-speed interface 1413 manages lower bandwidth-intensive operations. Such allocation of functions is an example only. In some implementations, the high-speed interface 1412 can be coupled to the memory 1410, a user interface (HMI) 1423, and to a keyboard 1424 and display 1425 (e.g., through a graphics processor or accelerator), and to the high-speed expansion ports 1414, which may accept various expansion cards (not shown) via bus 1450. In the implementation, the low-speed interface 1413 is coupled to the storage device 1411 and the low-speed expansion port 1415, via bus 1450. The low-speed expansion port 1415, which may include various communication ports (e.g., USB, Bluetooth, Ethernet, wireless Ethernet) may be coupled to one or more input/output devices 1405, and other devices a keyboard 1424, a pointing device (not shown), a scanner (not shown), or a networking device such as a switch or router, e.g., through a network adapter.

Still referring to FIG. 14, the centralized controller system 1400 may be implemented in a number of different forms, as shown in the figure. For example, it may be implemented as a standard server 1426, or multiple times in a group of such servers. In addition, it may be implemented in a personal computer such as a laptop computer 1427. It may also be implemented as part of a rack server system 1428. Alternatively, components from the computing device 1400 may be combined with other components in a mobile device (not shown), such as a mobile computing device having different component configuration arranged for mobile devices.

Features

According to another embodiment of the present disclosure, a system for monitoring and controlling an operation of an induction motor (IM). The system including sensors obtain sensor data from the IM within a time period. A controller coupled with the IM, the sensors and a memory. Wherein the memory includes stored databases and modules having executable instructions, and stored data including IM data. A processor of the controller is configured to detect a spectrum of a current signal from the sensor data using a signal processing module. Use the stored IM data to obtain a number of rotor bars and a number of pole pairs of the IM, to identify a principle slot harmonics (PSH) type IM from a set of IMs, and use the PSH type IM to identify a static eccentricity fault signature signal located at a secondary PSH frequency of the PSH type IM. Identify a level of signal strength in the spectrum of the current signal at a location of the secondary PSH frequency. Compare with a pre-computed SE fault table database to obtain a level of SE fault of the PSH-type IM; and compare the level of SE fault with a same corresponding level of an SE fault associated with a SE threshold with an anomaly database; and if outside the SE threshold, generate and send a SE fault operation interrupt command along with at least one command action for the time period. Receive the interrupt command and that at least one command action by the controller. The controller stops the PSH-type IM operation, and outputs the at least one command action to a communication network based on the interrupt command. Wherein the following aspects below are contemplated as configuring a modified embodiment of the above embodiment for one or a combination of the following aspects below.

According to aspects of the present disclosure, an aspect where the PSH IM includes H, where $R=2p[3(m\pm q)\pm r]$, where $(m\pm q)=1, 2, \ldots$ and $r=0$ or $1$, such that R is a number of rotor bars, p is a number of pole pairs, in is an integer, and q is an integer.

Another aspect may be that the sensor data includes current data obtained from current sensors within the time period, and voltage data obtained from voltage sensors, of the PSH-type IM, and also includes detected stator current data obtained from stator current sensors, and stator voltage data obtained from stator voltage sensors from the stator assembly, of the PSH-type IM.

Another aspect may be that the sensor data includes operating conditions of the IM within the time period including sensed current data and voltage data from one or more of multiple phases of the IM. Another aspect may be that the if the level of static eccentricity fault is within the static eccentricity threshold, then the PSH-type IM passes a static eccentricity fault test in a manufacturing phase, and is a healthy PSH-type IM, and no static eccentricity fault operation interrupt command is to be generated within the time period. Still another aspect is that the signal processing module includes a fast Fourier transformation operation used to calculate the spectrum of the current signal.

Another aspect is that upon identifying the number of rotor bars and the number of pole pairs of the IM, and identifying a type of IM from the set of IMs, the processor identifies a type of eccentricity fault that includes one of a dynamic eccentricity fault, a mixed eccentricity fault or the SE fault. Wherein the memory includes a pre-computed dynamic eccentricity fault database that is used to obtain a level of dynamic eccentricity fault of the identified type of IM. Wherein the memory includes a pre-computed mixed eccentricity fault database that is used to obtain a level of mixed eccentricity fault of the identified type of IM.

Such that an aspect is that the anomaly database includes a set of different levels of SE faults, such that each level of the set of different levels of SE faults includes an associated set of command actions, wherein the associated set of command actions include one or a combination of a level of operation inspection from a set of level of operation inspections, a type of repair action from a set of repair actions, a type of operational design action from a set of operational design actions. Still another aspect is the spectrum of the current signal is between 780 Hz and 900 Hz under varying SE levels. Wherein an exact frequency depends on the motor parameter in rotor bar and slot number, and also supply frequency. It would be too specific to list the exact frequency number in 780 and 900 Hz. Further another aspect is the PSH type IM is a three-phase IM, such that the sensors include at least one current sensor sensing the current data and at least one voltage sensor sensing voltage data from the three phases of the three-phase PSH induction motor.

Wherein an aspect is the current detect stator current and voltage sensors detect voltage data from a stator assembly of the PSH type IM.

Definitions

According to aspects of the present disclosure, and based on experimentation, the following definitions have been established, and certainly are not a complete definition of each phrase or term. Wherein the provided definitions are merely provided as an example, based upon learnings from experimentation, wherein other interpretations, definitions, and other aspects may pertain. However, for at least a mere basic preview of the phrase or term presented, such definitions have been provided.

Computing system: The computing system can include one or more processors for controlling operation of the computing system, and a memory for storing data and program instructions usable by the one or more processors. It is possible that the computing system can be configured to determine control inputs in accordance with apparatuses, systems and methods of the present disclosure. The computing system may also be configured for revising and/or optimizing one or more control policy usable for controlling a system, and the like. Also contemplated is that the computing system may be incorporated into a machine and configured to update/revise and optimize the control policy directed to controlling operation of the machine. The information (for example, data, instructions, and/or other information) required by the computing system to update/revise and/or optimize the control policy may be received from and/or obtained by any suitable venues, for example, from machine sensors or from other machine resources such as an external database via a wireless connection. At least some of the information (for example, data) required by the computing system to update/revise and/or optimize the control policy may be provided to the computing system (for example, as data or other information stored in a memory or memories) prior to operation of the machine. The computing system may also be configured to control the machine in accordance with the updated/revised or optimized control policy, to perform the machine operation. The optimized or updated/revised control policy generated by the remote computing system may then be loaded or installed into a machine computing system for deployment with the machine, to control the machine during operation.

Induction Motor: An induction motor or asynchronous motor is an AC electric motor in which the electric current in the rotor needed to produce torque is obtained by electromagnetic induction from the magnetic field of the stator winding. An induction motor can therefore be made without electrical connections to the rotor. An induction motor's rotor can be either wound type or squirrel-cage type.

Three-phase squirrel-cage induction motors are widely used as industrial drives because they are self-starting, reliable and economical. Single-phase induction motors are used extensively for smaller loads, such as household appliances like fans. Although traditionally used in fixed-speed service, induction motors are increasingly being used with variable-frequency drives (VFD) in variable-speed service. VFDs offer especially important energy savings opportunities for existing and prospective induction motors in variable-torque centrifugal fan, pump and compressor load applications. Squirrel cage induction motors are very widely used in both fixed-speed and variable-frequency drive applications. The construction of the induction motor can include the stator of an induction motor having of poles carrying supply current to induce a magnetic field that penetrates the rotor. To optimize the distribution of the magnetic field, windings are distributed in slots around the stator, with the magnetic field having the same number of north and south poles. Induction motors are most commonly run on single-phase or three-phase power, but two-phase motors exist; in theory, induction motors can have any number of phases. Many single-phase motors having two windings can be viewed as two-phase motors, since a capacitor is used to generate a second power phase 90° from the single-phase supply and feeds it to the second motor winding. Single-phase motors require some mechanism to produce a rotating field on startup. Cage induction motor rotor's conductor bars are typically skewed to avoid magnetic locking.

Principle Induction Motor Operation: In both induction and synchronous motors, the AC power supplied to the motor's stator creates a magnetic field that rotates in synchronism with the AC oscillations. Whereas a synchronous motor's rotor turns at the same rate as the stator field, an induction motor's rotor rotates at a somewhat slower speed than the stator field. The induction motor stator's magnetic field is therefore changing or rotating relative to the rotor. This induces an opposing current in the induction motor's rotor, in effect the motor's secondary winding, when the latter is short-circuited or closed through an external impedance. The rotating magnetic flux induces currents in the windings of the rotor, in a manner similar to currents induced in a transformer's secondary winding(s).

The induced currents in the rotor windings in turn create magnetic fields in the rotor that react against the stator field. The direction of the magnetic field created will be such as to oppose the change in current through the rotor windings, in agreement with Lenz's Law. The cause of induced current in the rotor windings is the rotating stator magnetic field, so to oppose the change in rotor-winding currents the rotor will start to rotate in the direction of the rotating stator magnetic field. The rotor accelerates until the magnitude of induced rotor current and torque balances the applied mechanical load on the rotation of the rotor. Since rotation at synchronous speed would result in no induced rotor current, an induction motor always operates slightly slower than synchronous speed. The difference, or "slip," between actual and synchronous speed varies from about 0.5% to 5.0% for standard Design B torque curve induction motors. The induction motor's essential character is that it is created solely by induction instead of being separately excited as in synchronous or DC machines or being self-magnetized as in permanent magnet motors.

For rotor currents to be induced, the speed of the physical rotor must be lower than that of the stator's rotating magnetic field (ns); otherwise the magnetic field would not be moving relative to the rotor conductors and no currents would be induced. As the speed of the rotor drops below synchronous speed, the rotation rate of the magnetic field in the rotor increases, inducing more current in the windings and creating more torque. The ratio between the rotation rate of the magnetic field induced in the rotor and the rotation rate of the stator's rotating field is called "slip". Under load, the speed drops and the slip increases enough to create sufficient torque to turn the load. For this reason, induction motors are sometimes referred to as "asynchronous motors".

An induction motor can be used as an induction generator, or it can be unrolled to form a linear induction motor which can directly generate linear motion. The generating mode for induction motors is complicated by the need to excite the rotor, which begins with only residual magnetization. In some cases, that residual magnetization is enough to selfexcite the motor under load. Therefore, it is necessary to either snap the motor and connect it momentarily to a live grid or to add capacitors charged initially by residual magnetism and providing the required reactive power during operation. Similar is the operation of the induction motor in parallel with a synchronous motor serving as a power factor compensator. A feature in the generator mode in parallel to the grid is that the rotor speed is higher than in the driving mode. Then active energy is being given to the grid. Another disadvantage of induction motor generator is that it consumes a significant magnetizing current I0=(20-35)%.

Embodiments

The following description provides exemplary embodiments only, and is not intended to limit the scope, applicability, or configuration of the disclosure. Rather, the following description of the exemplary embodiments will provide those skilled in the art with an enabling description for implementing one or more exemplary embodiments. Contemplated are various changes that may be made in the function and arrangement of elements without departing from the spirit and scope of the subject matter disclosed as set forth in the appended claims. Specific details are given in the following description to provide a thorough understanding of the embodiments. However, understood by one of ordinary skill in the art can be that the embodiments may be practiced without these specific details. For example, systems, processes, and other elements in the subject matter disclosed may be shown as components in block diagram form in order not to obscure the embodiments in unnecessary detail. In other instances, well-known processes, structures, and techniques may be shown without unnecessary detail in order to avoid obscuring the embodiments. Further, like reference numbers and designations in the various drawings indicated like elements. Although the present disclosure has been described with reference to certain preferred embodiments, it is to be understood that various other adaptations and modifications can be made within the spirit and scope of the present disclosure.

What is claimed is:

1. A system for controlling an operation of an induction motor (IM), comprising:
    obtain sensor data from IM sensors within a time period;
    a controller coupled with the IM, the IM sensors and a memory, wherein the memory includes stored databases and modules having executable instructions, and stored IM data, and a processor of the controller is configured to
        detect a spectrum of a current signal from the sensor data using a signal processing module;
        use the IM data to, obtain a number of rotor bars and a number of pole pairs of the IM to identify a principle slot harmonics (PSH) type IM from a set of IMs, and use the PSH-type IM to identify a static eccentricity (SE) fault signature signal located at a secondary PSH frequency of the PSH-type IM;
        determine a level of signal strength in the spectrum of the current signal at a location of the secondary PSH frequency, and compare to a SE fault table database to obtain a SE fault level of the PSH-type IM;
        compare the SE fault level to an anomaly database to obtain a SE fault threshold, and if the SE fault level is outside the SE threshold, generate and send an interrupt command with an associated command action to the controller for the time period; and
        stop the PSH-type IM operation upon receiving the interrupt command by the controller, and output the command action to a communication network to control the operation of the PSH-type IM based on the command action.

2. The system of claim 1, wherein the PSH IM includes R=2p[3(m±q)±r], where (m±q)=1, 2, . . . and r=0 or 1, such that R is a number of rotor bars, p is a number of pole pairs, in is an integer, and q is an integer.

3. The system of claim 1, wherein the sensor data includes current data obtained from current sensors within the time period, and voltage data obtained from voltage sensors, of the PSH-type IM, and also includes detected stator current data obtained from stator current sensors, and stator voltage data obtained from stator voltage sensors from a stator assembly, of the PSH-type IM.

4. The system of claim 1, wherein the sensor data includes operating conditions of the IM within the time period including sensed current data and voltage data from one or more of multiple phases of the IM, and the IM data is obtained before the time period.

5. The system of claim 1, wherein, if the level of SE fault is within the SE threshold, then the PSH-type IM passes a SE fault test in a manufacturing phase, and is a healthy PSH-type IM, and no SE fault operation interrupt command is to be generated within the time period.

6. The system of claim 1, wherein the signal processing module includes a fast Fourier transformation operation used to calculate the spectrum of the current signal.

7. The system of claim 1, wherein upon identifying the number of rotor bars and the number of pole pairs of the IM, and identifying a type of IM from the set of IMs, the processor identifies the type of eccentricity fault that includes one of a dynamic eccentricity fault, a mixed eccentricity fault or the SE fault.

8. The system of claim 7, wherein the memory includes a pre-computed dynamic eccentricity fault database that is used to obtain a level of dynamic eccentricity (DE) fault of an identified type of IM associated with DE faults.

9. The system of claim 7, wherein the memory includes a pre-computed mixed eccentricity (ME) fault database that is used to obtain a level of ME fault of an identified type of IM associated with ME faults.

10. The system of claim 1, wherein the anomaly database includes a set of different levels of SE faults, such that each level of the set of different levels of SE faults includes a set of command actions, wherein the set of command actions for each level of SE fault include one or a combination of a level of operation inspection from a set of level of operation inspections, a type of repair action from a set of repair actions, a type of operational design action from a set of operational design actions.

11. The system of claim 1, wherein the spectrum of the current signal includes a frequency range depending upon a motor parameter with a specific combination of a number of rotor bars and a number of slots.

12. The system of claim 1, wherein the PSH type IM is a three-phase IM, such that the IM sensors include at least one current sensor sensing current data and at least one voltage sensor sensing voltage data from the three phases of the three-phase PSH induction motor.

13. The system of claim 1, wherein the IM sensors include current sensors that detect stator current and voltage sensors that detect voltage data from the stator assembly of the PSH type IM.

14. A system for monitoring and controlling an operation of an induction motor (IM), comprising:

sensors obtain sensor data associated with the IM;
a controller is coupled with the IM, the sensors and a memory, the memory including stored databases and modules having executable instructions and data including IM data of the IM, and the controller controls operations of the IM based on receiving the sensor data;
a processor of the controller is configured to
  detect a spectrum of a current signal from the sensor data using a signal processing module;
  use the IM data to, to identify a static eccentricity (SE) fault signature signal located at a secondary PSH frequency of the PSH-type IM;
  determine a level of signal strength in the spectrum of the current signal at a location of the secondary PSH frequency, and compare to a SE fault table database to obtain a SE fault level of the PSH-type IM;
  compare the SE fault level to an anomaly database to obtain a SE fault threshold, and if the SE fault level is outside the SE threshold, generate and send an interrupt command with an associated command action to the controller; and
  stop the PSH-type IM operation upon receiving the interrupt command by the controller, and output the command action to a communication network to control the operation of the PSH-type IM based on the command action.

15. The system of claim 14, wherein the sensor data includes current data and voltage data acquired from the sensors that is communicated to the controller and includes the detected stator current data and the voltage data from a stator assembly of the PSH type IM.

16. The system of claim 14, wherein, if the level of SE fault is within the SE threshold, the PSH type IM passes an SE fault test in a manufacturing phase, and is a healthy PSH IM, and no SE fault operation interrupt command is generated.

17. The system of claim 14, wherein the types of eccentricity fault to be identified include one of a dynamic eccentricity (DE) fault, a mixed eccentricity (ME) fault or the SE fault.

18. The system of claim 14, wherein the sensor data includes operating conditions of the IM such as sensed current data and voltage data from one or more of multiple phases of the IM within a time period, and the IM data is collected at a different time before the sensor data is acquired by the sensors.

19. A method for controlling an operation of an induction motor (IM), comprising:
  receiving sensor data from sensors associated with the IM;
  using a controller coupled with the IM, the sensors, and a memory, the memory includes stored databases, modules having executable instructions and data including IM data, such that the controller controls operations of the IM based on the received sensor data;
  using a processor of the controller is configured to
    detecting a spectrum of a current signal from the sensor data using a signal processing module;
    using the IM data to, obtain a number of rotor bars and a number of pole pairs of the IM to identify a principle slot harmonics (PSH) type IM from a set of IMs, and use the PSH-type IM to identify a static eccentricity (SE) fault signature signal located at a secondary PSH frequency of the PSH-type IM;
    determining a level of signal strength in the spectrum of the current signal at a location of the secondary PSH frequency, and compare to a SE fault table database to obtain a SE fault level of the PSH-type IM;
    comparing the SE fault level to an anomaly database to obtain a SE fault threshold, and if the SE fault level is outside the SE threshold, generate and send an interrupt command with an associated command action to the controller for the time period; and
    stopping the PSH-type IM operation upon receiving the interrupt command by the controller, and outputting the command action to a communication network to control the operation of the PSH-type IM based on the command action.

20. The method of claim 19, wherein the signal processing module includes a fast Fourier transformation operation used to calculate the spectrum of the current signal.

21. A system for controlling an operation of an induction motor (IM), comprising:
  sensors obtain sensor data of the IM including current data and voltage data within a time period;
  a controller is coupled with the IM, the sensors and a memory, the memory including stored databases and modules having executable instructions and data including IM data of the IM, and the controller controls operations of the IM based on receiving the sensor data;
  a processor of the controller is configured to
    detect a spectrum of a current signal from the sensor data using a signal processing module;
    use the IM data to, obtain a number of rotor bars and a number of pole pairs of the IM to identify the IM from a set of IMs, wherein the set of IMs include a squirrel cage induction motor having a number of rotor bars with a motor configuration including a rotor positioned inside and a stator assembly outside, and use the IM to identify a static eccentricity (SE) fault signature signal located at a secondary PSH frequency of the IM;
    determine a level of signal strength in the spectrum of the current signal at a location of the secondary PSH frequency, and compare to a SE fault table database to obtain a SE fault level of the IM;
    compare the SE fault level to an anomaly database to obtain a SE fault threshold, and if the SE fault level is outside the SE threshold, generate and send an interrupt command with an associated command action to the controller for the time period; and
    stop the IM operation upon receiving the interrupt command by the controller, and output the command action to a communication network to control the operation of the IM based on the command action.

* * * * *